(12) United States Patent
Jung et al.

(10) Patent No.: US 11,532,581 B2
(45) Date of Patent: Dec. 20, 2022

(54) SEMICONDUCTOR DEVICES HAVING BONDING STRUCTURES WITH BONDING PADS AND METAL PATTERNS

(71) Applicant: Samsung Electronics Co., Ltd., Suwon-si (KR)

(72) Inventors: Uidam Jung, Suwon-si (KR); Hyoungyol Mun, Yongin-si (KR); Sangjun Park, Yongin-si (KR); Kyuha Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 18 days.

(21) Appl. No.: 17/158,450

(22) Filed: Jan. 26, 2021

(65) Prior Publication Data

US 2021/0343669 A1 Nov. 4, 2021

(30) Foreign Application Priority Data

Apr. 29, 2020 (KR) .................. 10-2020-0052606

(51) Int. Cl.
*H01L 23/00* (2006.01)
*H01L 25/065* (2006.01)
*H01L 25/18* (2006.01)

(52) U.S. Cl.
CPC .............. *H01L 24/08* (2013.01); *H01L 24/03* (2013.01); *H01L 24/05* (2013.01);
(Continued)

(58) Field of Classification Search
CPC ......... H01L 24/08; H01L 24/03; H01L 24/05; H01L 25/0657; H01L 25/18;
(Continued)

(56) References Cited

U.S. PATENT DOCUMENTS

| 8,481,406 | B2 | 7/2013 | Sadaka et al. |
| 9,190,345 | B1 | 11/2015 | Chen et al. |
| 10,475,758 | B2 | 11/2019 | Yang et al. |
| 11,251,157 | B2 * | 2/2022 | Yang .................. H01L 25/50 |

(Continued)

FOREIGN PATENT DOCUMENTS

| JP | 2000012605 A | 1/2000 |
| JP | 2019114595 A | 7/2019 |
| KR | 101993314 B1 | 6/2019 |

*Primary Examiner* — Mamadou L Diallo
(74) *Attorney, Agent, or Firm* — Harness, Dickey & Pierce, P.L.C.

(57) ABSTRACT

A semiconductor device includes a first structure including a first bonding structure, and a second structure on the first structure and including a second bonding structure connected to the first bonding structure. The first bonding structure includes a first insulating layer, a first bonding insulating layer on the first insulating layer, first bonding pads penetrating at least a portion of the first insulating layer and the first bonding insulating layer, and first metal patterns in the first insulating layer and in contact with the first bonding insulating layer, and having an upper surface at a lower level than upper surfaces of the first bonding pads. The second bonding structure includes a second bonding insulating layer bonded to the first bonding insulating layer, a second insulating layer on the second bonding insulating layer, and second bonding pads penetrating the second bonding insulating layer and connected to the first bonding pads.

20 Claims, 22 Drawing Sheets

(52) U.S. Cl.
CPC .......... *H01L 25/0657* (2013.01); *H01L 25/18* (2013.01); *H01L 2224/05082* (2013.01); *H01L 2224/05147* (2013.01); *H01L 2224/08145* (2013.01); *H01L 2924/1431* (2013.01); *H01L 2924/14511* (2013.01)

(58) Field of Classification Search
CPC . H01L 2224/05082; H01L 2224/05147; H01L 2224/08145; H01L 2924/1431; H01L 2924/14511; H01L 2225/06548; H01L 2225/06562; H01L 2225/06568; H01L 2225/06524; H01L 23/522; H01L 23/5221; H01L 23/5283; H01L 25/0652; H01L 23/48; H01L 24/75; H01L 27/11548; H01L 27/11556; H01L 27/11575; H01L 27/11582; H01L 2224/0807; H01L 2224/1607
See application file for complete search history.

(56) References Cited

U.S. PATENT DOCUMENTS

| | | | |
|---|---|---|---|
| 11,264,343 B2* | 3/2022 | Chen | H01L 21/76879 |
| 2017/0179029 A1 | 6/2017 | Enquist et al. | |
| 2019/0131276 A1* | 5/2019 | Chen | H01L 24/19 |
| 2019/0221557 A1* | 7/2019 | Kim | H01L 27/1157 |
| 2020/0098709 A1* | 3/2020 | Lin | H01L 24/16 |
| 2020/0328186 A1* | 10/2020 | Liu | H01L 24/32 |
| 2021/0035965 A1* | 2/2021 | Mizutani | H01L 27/11582 |
| 2021/0066255 A1* | 3/2021 | Chen | H01L 24/06 |
| 2021/0091063 A1* | 3/2021 | Ninomiya | H01L 27/11556 |
| 2021/0202418 A1* | 7/2021 | Lin | H01L 24/09 |
| 2021/0265313 A1* | 8/2021 | Chen | H01L 25/18 |
| 2021/0296299 A1* | 9/2021 | Shibata | H01L 21/78 |
| 2022/0013480 A1* | 1/2022 | Chen | H01L 23/645 |
| 2022/0045005 A1* | 2/2022 | Cui | H01L 25/50 |
| 2022/0068857 A1* | 3/2022 | Chen | H01L 24/80 |
| 2022/0093555 A1* | 3/2022 | Hou | H01L 24/08 |

* cited by examiner

SEMICONDUCTOR DEVICES HAVING BONDING STRUCTURES WITH BONDING PADS AND METAL PATTERNS

CROSS-REFERENCE TO RELATED APPLICATION

This application claims benefit of priority, under 35 U.S.C. § 119, to Korean Patent Application No. 10-2020-0052606 filed on Apr. 29, 2020 in the Korean Intellectual Property Office, the disclosure of which is incorporated herein by reference in its entirety.

BACKGROUND

Example embodiments of the inventive concepts relate to semiconductor devices.

Semiconductor device may be desired to have a reduced volume and to process high capacity data. Accordingly, it has been desired to increase integration density of a semiconductor element included in a semiconductor device.

SUMMARY

Some example embodiments of the inventive concepts provide a semiconductor device in which a bonding pad forming layer and a metal pattern used as a wiring may be simultaneously formed, such that processes and costs may be reduced. A semiconductor device in which a method of bonding wafers is applied may be provided, to improve integration density of the semiconductor device.

According to some example embodiments of the inventive concepts, a semiconductor device includes a first structure including a first bonding structure, and a second structure on the first structure and including a second bonding structure connected to the first bonding structure, wherein the first bonding structure includes a first insulating layer, a first bonding insulating layer on the first insulating layer, first bonding pads penetrating at least a portion of the first insulating layer and the first bonding insulating layer, and first metal patterns in the first insulating layer, the first metal patterns in contact with the first bonding insulating layer, the first metal patterns each having an upper surface closer to a lower surface of the first structure, in a vertical direction extending perpendicular to the lower surface of the first structure, than upper surfaces of the first bonding pads, wherein the second bonding structure includes a second bonding insulating layer bonded to the first bonding insulating layer, a second insulating layer on the second bonding insulating layer, and second bonding pads penetrating the second bonding insulating layer and connected to the first bonding pads.

According to some example embodiments of the inventive concepts, a semiconductor device includes a first structure including a first bonding structure, and a second structure on the first structure and including a second bonding structure connected to the first bonding structure, wherein the first bonding structure includes a first insulating layer, a first bonding insulating layer on the first insulating layer, first bonding pads penetrating a portion of the first insulating layer and the first bonding insulating layer, and first metal patterns in the first insulating layer and in contact with the first bonding insulating layer, and wherein the first bonding insulating layer includes a first region penetrated by the first bonding pads and a second region in contact with a portion of the first metal patterns.

According to some example embodiments of the inventive concepts, a semiconductor device includes a first bonding structure having a first bonding surface, and a second bonding structure on the first bonding structure and having a second bonding surface in contact with the first bonding surface, and wherein the first bonding structure includes a first insulating layer, a first bonding insulating layer on the first insulating layer and at least partially defining the first bonding surface, first bonding pads that penetrate at least a portion of the first insulating layer and the first bonding insulating layer and at least partially defining the first bonding surface, and first metal patterns in the first insulating layer and each having an upper surface below the first bonding surface.

BRIEF DESCRIPTION OF DRAWINGS

The above and other aspects, features, and advantages of the inventive concepts will be more clearly understood from the following detailed description, taken in conjunction with the accompanying drawings, in which.

DETAILED DESCRIPTION

Hereinafter, some example embodiments of the inventive concepts will be described as follows with reference to the accompanying drawings. In the description below, the terms "upper," "upper portion," "upper surface," "lower," "lower portion," "lower surface," "lateral surface," and the like, may be indicated with reference to the diagrams unless otherwise indicated.

Figure 1:
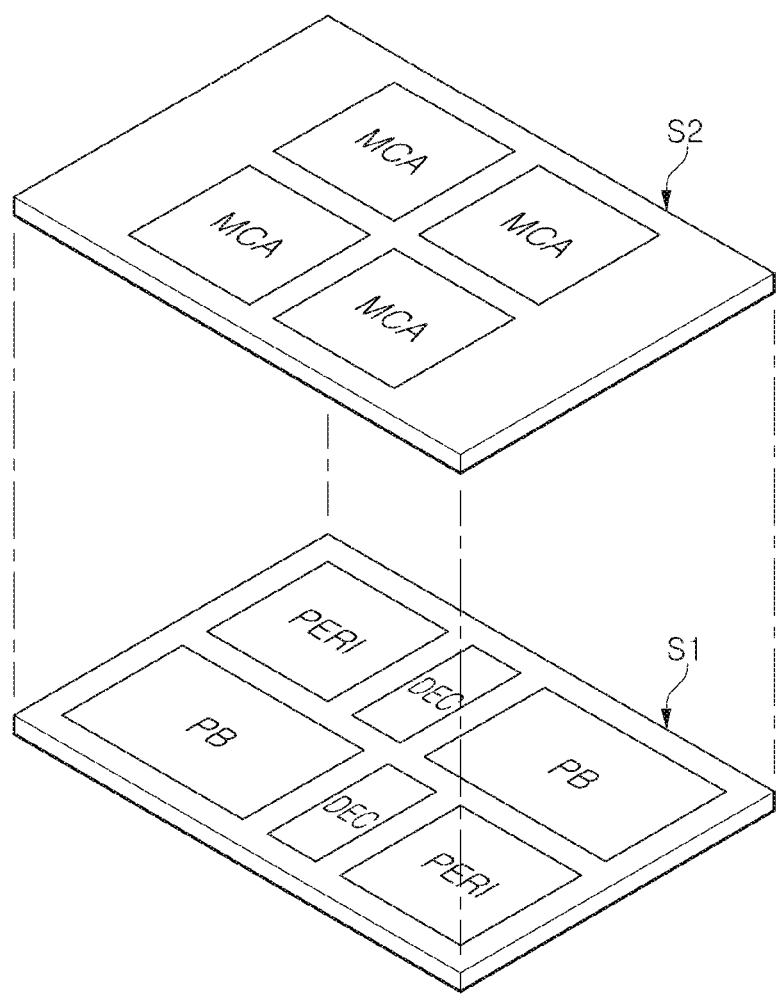
FIG. 1 is a layout diagram illustrating arrangement of a semiconductor device according to some example embodiments of the inventive concepts.

FIG. 1 is a layout diagram illustrating arrangement of a semiconductor device according to some example embodiments.

Referring to FIG. 1, a semiconductor device 10 in some example embodiments may include a first structure S1 and a second structure S2. The first structure S1 and the second structure S2 may be bonded to and combined to each other.

The first structure S1 may include a peripheral circuit, and the second structure S2 may include a memory cell array region MCA. A plurality of the memory cell array regions MCA may be disposed in the second structure S2. In some example embodiments, the first structure S1 may be referred to as a logic chip structure, and the second structure S2 may be referred to as a memory chip structure.

The peripheral circuit may include a row decoder DEC, a page buffer PB, and other circuits PERI. The other circuits PERI may include a latch circuit, a cache circuit, a sense amplifier, an input and output buffer, an electrostatic discharge (ED) device, or a data input and output circuit. The row decoder DEC, the page buffer PB, and the circuits PERI in the peripheral circuit may be disposed in various forms.

Figure 2A:
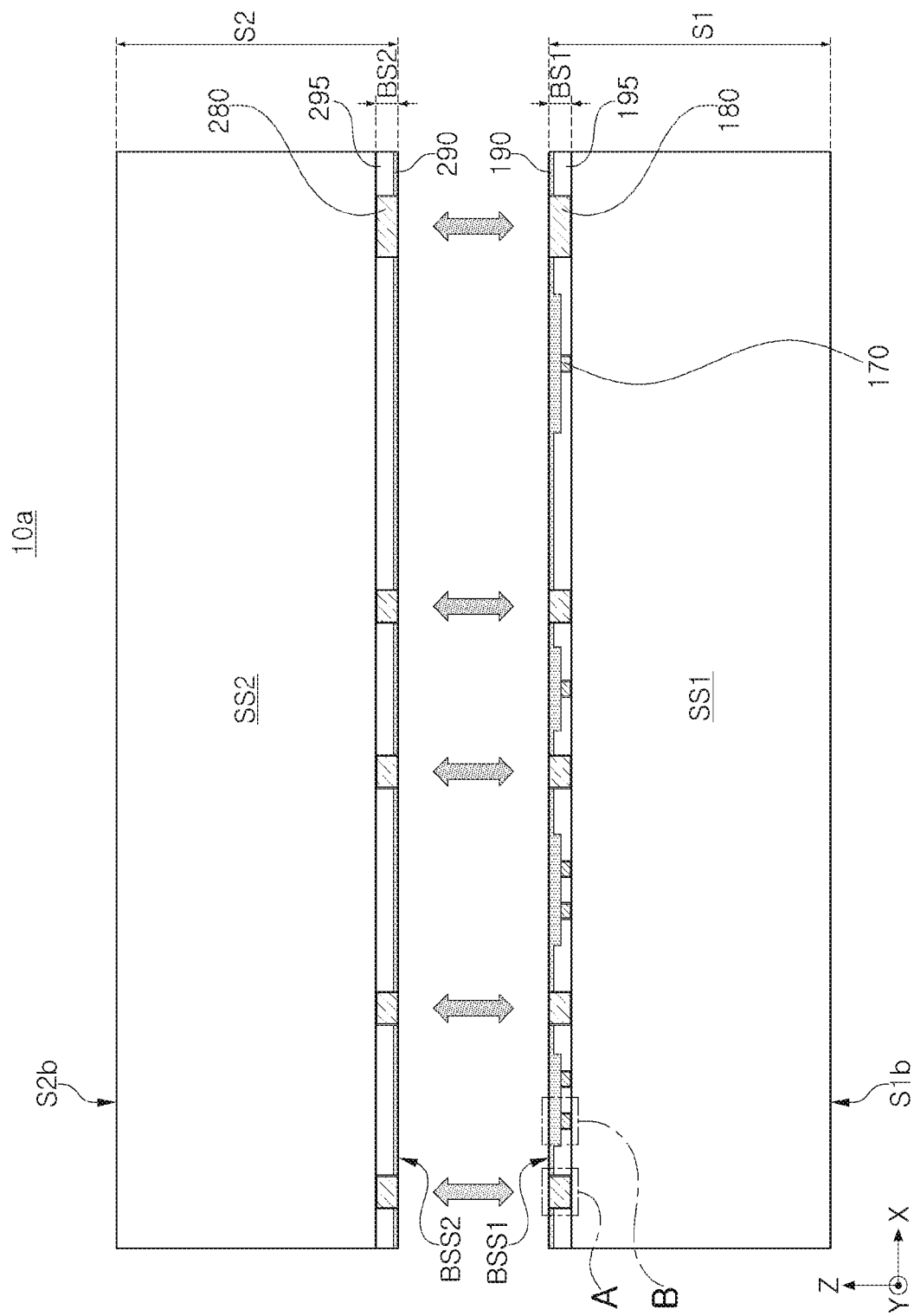
FIGS. 2A and 2B are cross-sectional diagrams illustrating a semiconductor device according to some example embodiments of the inventive concepts.
Figure 2B:
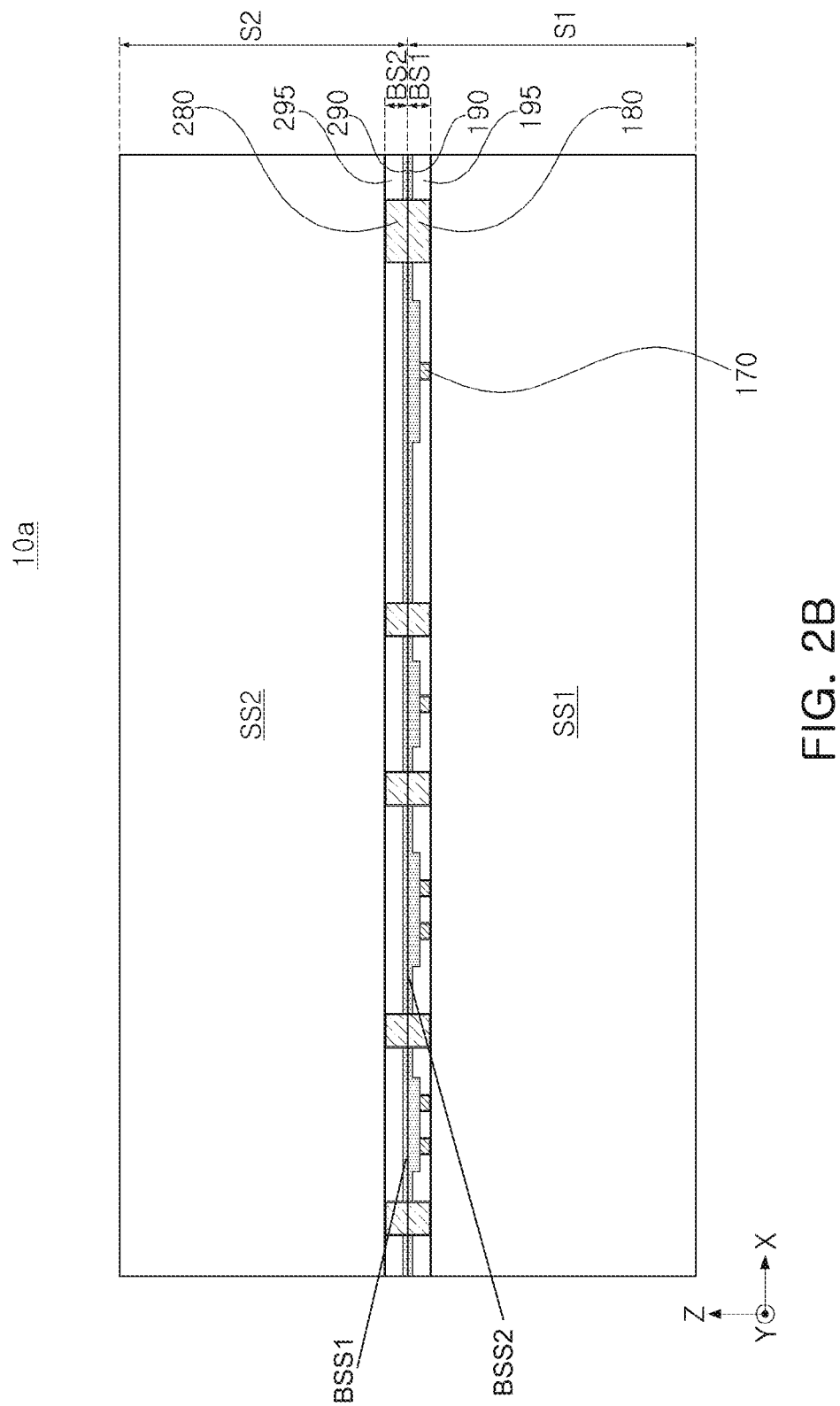

FIGS. 2A and 2B are cross-sectional diagrams illustrating a semiconductor device according to some example embodiments.

Figure 3:
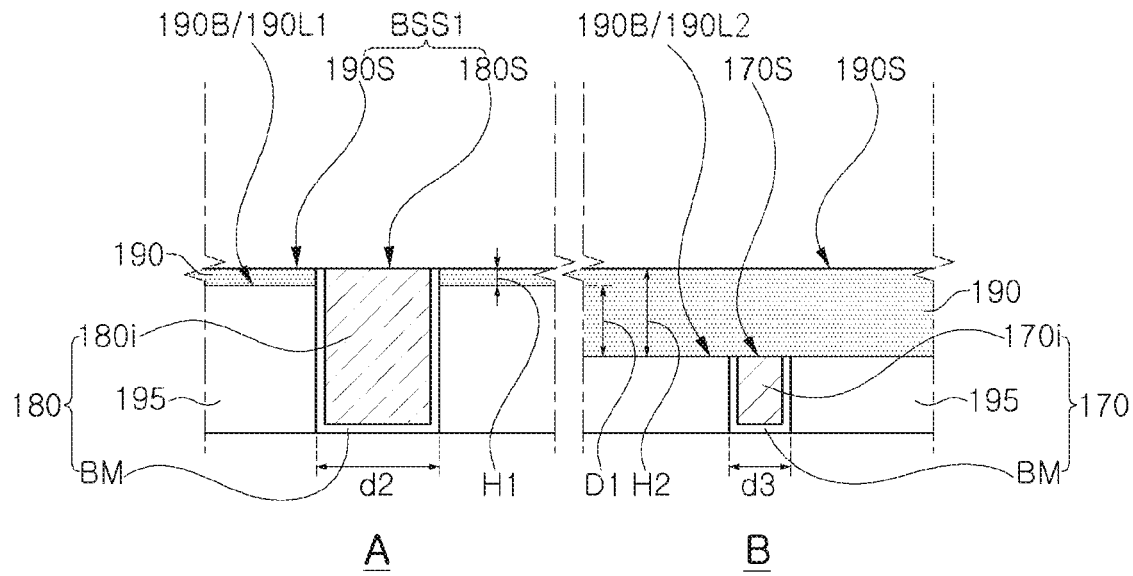
FIG. 3 is a cross-sectional diagram illustrating a portion of a semiconductor device according to some example embodiments of the inventive concepts.

FIG. 3 is a cross-sectional diagram illustrating a portion of a semiconductor device according to some example embodiments.

Referring to FIGS. 2A to 3, a semiconductor device 10a may include a first structure S1 and a second structure S2 upwardly and downwardly stacked. FIG. 2A illustrates a state before the first structure S1 and the second structure S2 are bonded to each other, and FIG. 2B illustrates a state in which the first structure S1 and the second structure S2 are bonded to each other. FIG. 3 is an enlarged diagram illustrating region "A" and region "B" illustrated in FIG. 2A.

The first structure S1 may include a first substrate structure SS1 and a first bonding structure BS1 disposed on the first substrate structure SS1. The second structure S2 may include a second bonding structure BS2 and a second substrate structure SS2 disposed on the second bonding structure BS2. The second bonding structure BS2 may be connected to (e.g., directly contacting) the first bonding structure BS1. As shown, the first bonding structure BS1 may have a first bonding surface BSS1, and the second bonding structure BS2 may have a second bonding surface BSS2 in contact with the first bonding surface BSS1. The first substrate structure SS1 may include a peripheral circuit region in which circuit devices are electrically connected to each other, and the second substrate structure SS2 may include a memory cell region.

It will be understood that an element that is described herein to be "on" another element may be directly on the other element or indirectly on the other element. An element that is directly on another element will be understood to be in direct contact with the other element. An element that is indirectly on another element will be understood to be isolated from direct contact with the other element by one or more interposing spaces and/or structures. Additionally, it will be understood that an element that is described herein to be "on" another element may be "above" or "beneath" the other element.

The first bonding structure BS1 may include a first insulating layer 195, a first bonding insulating layer 190 disposed (e.g., located) on the first insulating layer 195, and first bonding pads 180 penetrating at least a portion of the first insulating layer 195 and the first bonding insulating layer 190. The second bonding structure BS2 may include a second bonding insulating layer 290, a second insulating layer 295 disposed on the second bonding insulating layer 290, and second bonding pads 280 penetrating at least a portion of the second insulating layer 295 and the second bonding insulating layer 290. The second bonding insulating layer 290 may be bonded (e.g., affixed, adhered, etc.) to the first bonding insulating layer 190. The second bonding pads 280 may be connected to separate, respective first bonding pads 180.

The first bonding pads 180 may have an upper surface 180S providing a bonding surface of the first structure S1 (e.g., a first bonding surface BSS1 of the first bonding structure BS1) along with an upper surface 190S of the first bonding insulating layer 190 (which may include upper surfaces of the conductive layer 180i and barrier metal layer BM of the first bonding pads 180), and the second bonding pads 280 may have a lower surface providing a bonding surface of the second structure S2 along with an upper surface of the second bonding insulating layer 290 (e.g., the second bonding surface BSS2). Restated, the first bonding insulating layer 190 and the first bonding pads 180 may collectively define the first bonding surface BSS1 and the second bonding insulation layer 290 and the second bonding pads 280 may collectively define the second bonding surface BSS2. Upper surfaces of the first and second bonding pads 180 and 280 may be exposed at the bonding surfaces of the first structure S1 and the second structure S2. The first bonding pads 180 may function as bonding layers for bonding the first structure S1 and the second structure S2 along with the second bonding pads 280. The first bonding pads 180 may have a relatively large plane area as compared to the other wiring structures to provide the bonding with the second structure S2 and an electrical connection path according to the bonding. The first bonding pads 180 may be disposed in a position corresponding to the second bonding pads 280, and each of the first bonding pads 180 may have a size substantially the same as or similar to a size of each of the second bonding pads 280. The first bonding pads 180 may include a conductive material, such as copper (Cu), for example. A level of lower surfaces of the first bonding pads 180 and a level of lower surfaces of the first metal patterns 170 may be substantially the same (e.g., the lower surfaces of the first bonding pads 180 and a level of lower surfaces of the first metal patterns 170 may be a same or substantially same distance from the lower surface S1b of the first structure S1 in the Z-direction that is a vertical direction perpendicular to the lower surface S1b), but some example embodiments thereof are not limited thereto.

It will be understood that a "level" of a surface, end, or the like of the first structure S1 and/or the second structure S2 as described herein, may refer to a distance of the given surface, end, or the like from the lower surface S1b of the first structure S1, which may be the lower surface of the first substrate structure SS1 as shown in FIG. 2A, in a vertical direction that extends perpendicular to the lower surface S1b (e.g., the Z-direction). Accordingly, a surface in the first structure S1 having a "lower level" than another surface or end will be understood to be closer to the lower surface S1b than the other surface or end in the Z-direction.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements, which may include devices and/or operations, and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements, which may include devices and/or operations, and/or properties thereof described herein as being "substantially" the same encompasses elements and/or properties thereof that are the same within manufacturing tolerances and/or material tolerances and/or elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof (e.g., structures, properties of one or more elements, lengths, distances, parallel or perpendicular arrangement, or the like).

Further, regardless of whether elements and/or properties thereof (e.g., structures, surfaces, directions, or the like) are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The first and second bonding insulating layers 190 and 290 may be formed of an insulating material such that the first and second bonding insulating layers 190 and 290 may be in contact with and bonded to each other. For example, the first and second bonding insulating layers 190 and 290 may include at least one of SiCN, SiO, SiN, SiOC, SiON, or SiOCN. The first and second bonding insulating layers 190 and 290 may be formed of the same material, and an interfacial surface formed as a single layer may be formed between the first and second bonding insulating layers 190 and 290 as the first and second bonding insulating layers 190 and 290 are bonded to each other. The interfacial surface between the first and second bonding insulating layers 190 and 290 may include $SiO_2$.

The first and second structures S1 and S2 may be bonded to each other by the bonding between the first and second bonding pads 180 and 280, copper (Cu) to copper (Cu) bonding, for example. As each of the first and second bonding pads 180 and 280 may have an area relatively larger than areas of the other elements of the wiring structure, reliability of electrical connection between the first and second structures S1 and S2 may improve. In some example embodiments, the first and second structures S1 and S2 may be bonded to each other by copper (Cu) to copper (Cu) bonding between the first and second bonding pads 180 and 280, and hybrid bonding by dielectric material to dielectric material bonding between the first bonding insulating layer 190 and the second bonding insulating layer 290 disposed on circumferences of the first and second bonding pads 180 and 280.

In the first bonding structure BS1, first metal patterns 170 disposed in the first insulating layer 195 (e.g., located within a volume space defined by the outer surfaces of first insulating layer 195, for example as shown in at least FIG. 3) and configured to be in contact (e.g., direct contact) with the first bonding insulating layer 190 may be further included. Each of the first metal patterns 170 may have a width smaller than a width of each of the first bonding pads 180 in one direction, an x direction, for example, but some example embodiments thereof are not limited thereto. The first metal patterns 170 may be covered by the first bonding insulating layer 190 such that upper surfaces 170S thereof may not be exposed (e.g., the upper surfaces 170S of each of the first metal patterns 170 may be below, and isolated from direct contact with, the first bonding surface BSS1). The first metal patterns 170 may include a conductive material, for example, copper (Cu), tungsten (W), aluminum (Al), tungsten nitride (WN), tantalum nitride (TaN), titanium nitride (TiN), or combinations thereof. The first metal patterns 170 may be electrically connected to a peripheral circuit region disposed in the first substrate structure SS1, and may be used for input and output wiring, but some example embodiments thereof are not limited thereto. As shown in at least FIGS. 2A and 3, the first metal patterns 170 may each have an upper surface 170S that is at a lower level (e.g., closer to a lower surface S1*b* of the first structure S1, in a direction extending perpendicular to the lower surface S1*b* of the first structure S1, such as the Z direction), than upper surfaces 180S of the first bonding pads 180.

In FIG. 3, as for the first metal patterns 170 and the first and second bonding pads 180 and 280, a maximum width d3 of each of the first metal patterns 170 may be configured to be smaller than a width d2 of each of the first bonding pads 180, but some example embodiments thereof are not limited thereto. Each of the first metal patterns 170 and the first and second bonding pads 180 and 280 may include a conductive layer and barrier metal layer BM at least partially covering the conductive layer. The barrier metal layer BM may be configured to cover lower portions and lateral surfaces of the first metal patterns 170 and the first bonding pads 180 and upper portions and lateral surfaces of the second bonding pads 280. The barrier metal layer BM may prevent a conductive material (e.g., conductive layer) forming the first metal patterns 170 and the first and second bonding pads 180 and 280 from being diffused to a peripheral insulating layer. The barrier metal layer BM may be formed of one material selected from among Ta, TaN, TaSiN, Ti, TiN, TiSiN, W, WN, or combinations thereof. As shown in at least FIG. 3, the first metal patterns 170 may include a conductive layer 170*i* and a barrier metal layer BM partially covering the conductive layer 170*i*, the first bonding pad 180 includes a conductive layer 180*i* and a barrier metal layer BM partially covering the conductive layer 180*i*, and the second bonding pad 280 may include a conductive layer and barrier metal layer having similar structure as shown in FIG. 3 with regard to the first bonding pad 180. Accordingly, each of the first metal patterns 170 and the first and second bonding pads 180 and 280 may include a conductive layer and a barrier metal layer at least partially covering the conductive layer.

The first and second insulating layers 195 and 295 may include an insulating material such as silicon oxide or silicon nitride, and may include an insulating material different from those of the first and second bonding insulating layers 190 and 290, but some example embodiments thereof are not limited thereto. It will be understood that the first insulating layer 195 and the first bonding insulating layer 190 may include different materials (e.g., may have different total material compositions), but example embodiments are not limited thereto.

As illustrated in FIG. 3, the first bonding insulating layer 190 may include a first region A penetrated by the first bonding pad 180 and a second region B in contact with the first metal pattern 170. Restated, the first bonding insulating layer 190 may include a first region A in which the first bonding pads 180 are located and a second region B in which the first metal patterns 170 are located. The first bonding insulating layer 190 in the first region A and the first bonding insulating layer 190 in the second region B may have different thicknesses (e.g., different magnitudes of thickness), and a thickness of the first bonding insulating layer 190 in the second region B may be greater (e.g., greater in magnitude) than a thickness of the first bonding insulating layer 190 in the first region A. Accordingly, an upper surface 190S of the first bonding insulating layer 190 may be coplanar in the first region A and the second region B, and a lower surface 190B of the first bonding insulating layer 190 may be disposed on a different level in the first region A and the second region B. As shown in FIG. 3, a level (e.g., distance from the lower surface S1B in the Z-direction) of a first lowermost surface 190B=190L1 of the first bonding insulating layer 190 in the first region A is different from a level (e.g., distance from the lower surface S1B in the Z-direction) of a second lowermost surface 190B=190L2 of the first bonding insulating layer 190 in the second region B. As shown in FIG. 3, the first metal patterns 170 may be on (e.g., beneath) a lower portion of the second lowermost surface 190B=190L2 of the first bonding insulating layer 190.

The upper surface 190S of the first bonding insulating layer 190 may be substantially coplanar with upper surfaces 180S of the first bonding pads 180 in the first region A and the second region B. Accordingly, as shown in at least FIGS. 2A and 3, the first bonding pads 180 may each penetrate (e.g., penetrate completely through) the first bonding insulating layer 190 in the first region A. A difference D1 between a thickness of the first bonding insulating layer 190 in the first region A and in the second region B may be within a range of about 0.2 μm to about 0.3 μm. In the second region B, and as shown in FIGS. 2A and 3, the first metal patterns 170 may each be in contact (e.g., direct contact) with a lower surface 190B of the first bonding insulating layer 190, and an upper surface 170S of the first metal pattern 170 may be covered by the first bonding insulating layer 190. Accordingly, the upper surface 170S of the first metal pattern 170 may not be exposed at an upper portion of the first bonding structure BS1. As shown in FIG. 3, a distance between the upper surfaces 170S of the first metal patterns 170 and the first bonding surface BSS1 in the Z-direction may be greater than a thickness of the first region A of the first bonding insulating layer 190 in the Z-direction. When the first metal patterns 170 are exposed at an upper portion of the first structure S1, as an insulating material of the second bonding insulating layer 290 and a conductive material of the first metal pattern 170 may not be bonded to each other, a non-bonded area may increase such that bonding strength between the first structure S1 and the second structure S2 may degrade. However, in the first structure S1, when the thickness of the first bonding insulating layers 190 in the first region A and in the second region B have a difference therebetween, as the first metal patterns 170 used for input and output wirings, and the like, may not be exposed at a bonding surface of the first bonding structure BS1, bonding strength between the first and second structures S1 and S2 may increase further than the example in which the first metal patterns 170 are exposed. Accordingly, reliability of electrical connection by the bonding may improve.

In some example embodiments, the first bonding insulating layer 190 may be understood to be divided into first and second regions A and B, where the first bonding insulating layer 190 includes one or more first regions A (e.g., a singular, continuous first region A surrounding multiple second regions B) that are penetrated by the first bonding pads 180 and one or more second regions B that are each in contact with a portion (e.g., a limited portion) of the first metal patterns 170 in the first bonding structure BS1 (e.g., separate second regions B of the first bonding insulating layer 190 are in contact with separate, respective portions of the first metal patterns 170 of the first bonding structure BS1).

It will be understood that a "thickness" of a layer, region or the like within the first structure S1 as described herein is a thickness in the vertical direction that is perpendicular to the lower surface S1*b* (e.g. the Z-direction), and a "thickness" of a layer, region or the like within the second structure S2 as described herein is a thickness in the vertical direction that is perpendicular to the lower surface S2*b* (e.g. the Z-direction). Thicknesses of layers, regions or the like in the first or second structures S1 or S2 may be a thickness in a same direction (e.g., the Z-direction)

Figure 4A:
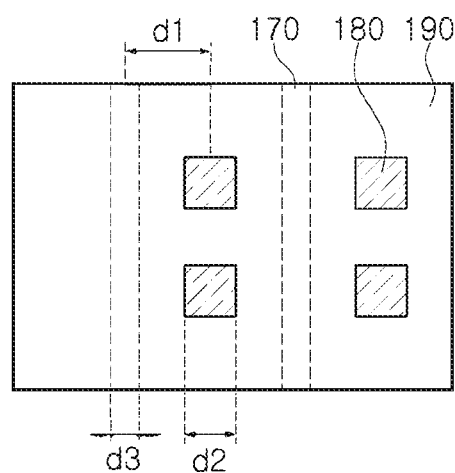
FIGS. 4A, 4B, and 4C are layout diagrams illustrating a portion of elements of a semiconductor device according to some example embodiments of the inventive concepts.
Figure 4B:
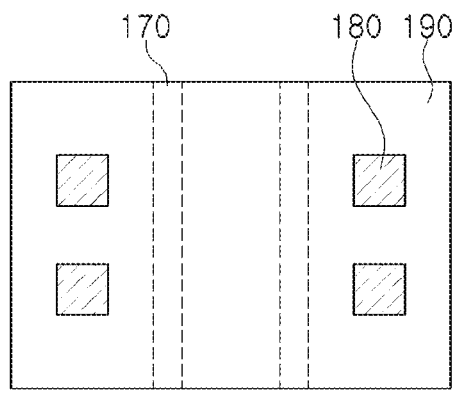
Figure 4C:
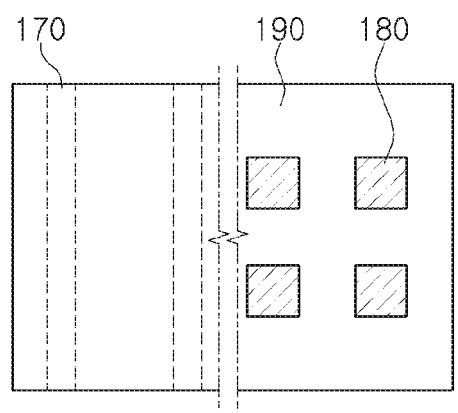

FIGS. 4A, 4B, and 4C are layout diagrams illustrating a portion of elements of a semiconductor device according to some example embodiments.

FIGS. 4A to 4C are plan diagrams illustrating a bonding surface of the first bonding structure BS1 viewed from an upper portion of the first structure S1. An upper surface of the first bonding insulating layer 190 and upper surfaces of the first bonding pads 180 may be exposed at a bonding surface of the first bonding structure BS1. The first metal patterns 170 may be covered by the first bonding insulating layer 190 such that upper surfaces thereof may not be exposed.

In the diagram, the first metal patterns 170 are illustrated to extend in one direction, but some example embodiments thereof are not limited thereto. The first metal patterns 170 may be disposed in various directions according to arrangement of an external input and output contact. For example, the first metal patterns 170 may extend in a first direction, and each of the first metal patterns 170 may include bent portion configured to be bent to extend in a second direction perpendicular to the first direction. The number of each of the first bonding pads 180 and the first metal patterns 170 and arrangement of each of the first bonding pads 180 and the first metal patterns 170 may be varied in some example embodiments, and FIGS. 4A to 4C illustrate an example of the arrangement.

FIG. 4A illustrates a bonding surface on which a single first metal pattern 170 is disposed between at least one first bonding pad 180 and the other first bonding pad 180, and FIG. 4B illustrates a bonding surface on which two first metal patterns 170 are disposed between at least one first bonding pad 180 and the other first bonding pad 180. FIG. 4C illustrates a bonding surface divided into a region in which the first bonding pads 180 are consecutively disposed and a region in which the first metal patterns 170 are consecutively disposed.

As illustrated in FIGS. 4A and 4B, one or two first metal patterns 170 may be disposed between at least one first bonding pad 180 and the other first bonding pad 180. A gap d1 between the first bonding pad 180 and the first metal pattern 170 may be within a range of about 1.2 μm to 2.0 μm, for example. Each of the first bonding pads 180 may have a square shape, a quadrangular shape, or a circular shape, and a shape of the first bonding pads 180 are not limited thereto. A width d2 of each of the first bonding pads 180 may be within a range of about 0.5 μm to 0.8 μm, for example. A maximum width d3 of each of the first metal patterns 170 may be smaller than or greater than the width d2 of each of the first bonding pads, and may be, for example, about 0.2 μm or greater.

As illustrated in FIG. 4C, the region in which the first bonding pads 180 are consecutively disposed may be adjacent to the region in which the first metal patterns 170 are consecutively disposed, but some example embodiments thereof are not limited thereto.

The above configuration may also be applied to a plane of a bonding surface of the first bonding structure BS1 viewed from an upper portion of the first structure S1 and also a plane of a bonding surface of the second bonding structure BS2 viewed from a lower portion of the second structure S2.

Figure 5A:
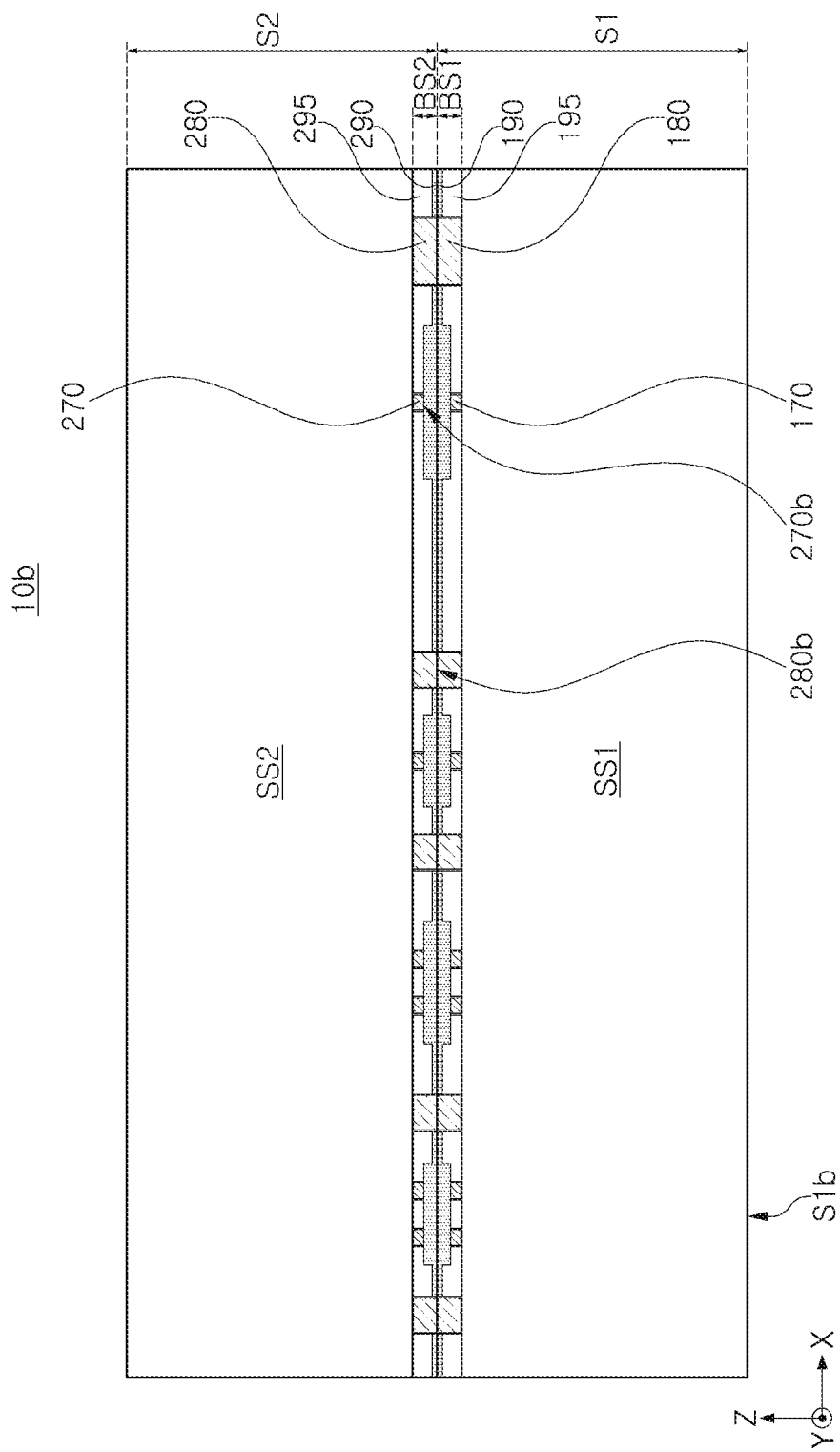
FIGS. 5A, 5B, and 5C are cross-sectional diagrams illustrating a semiconductor device according to some example embodiments of the inventive concepts.
Figure 5B:
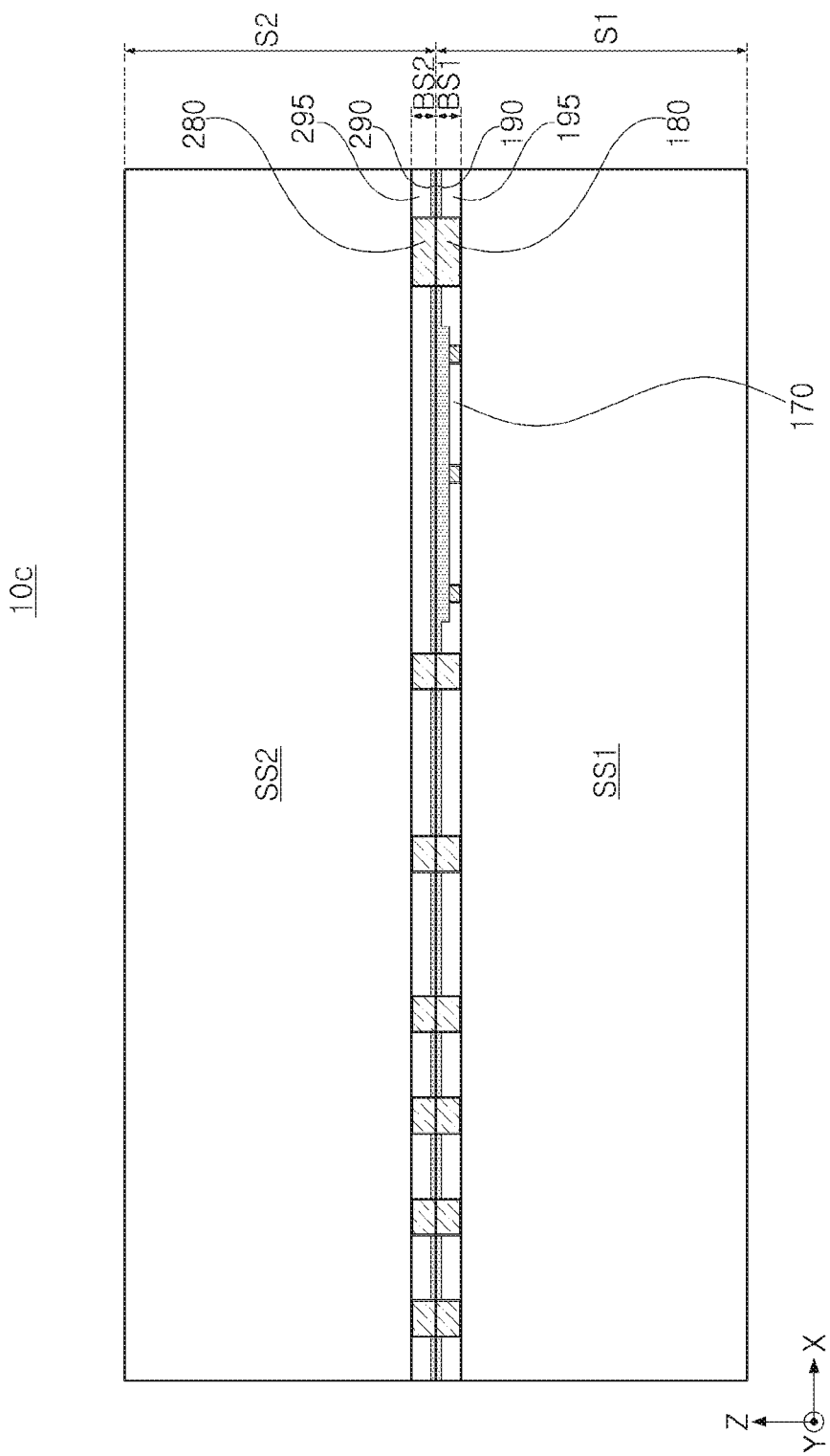
Figure 5C:
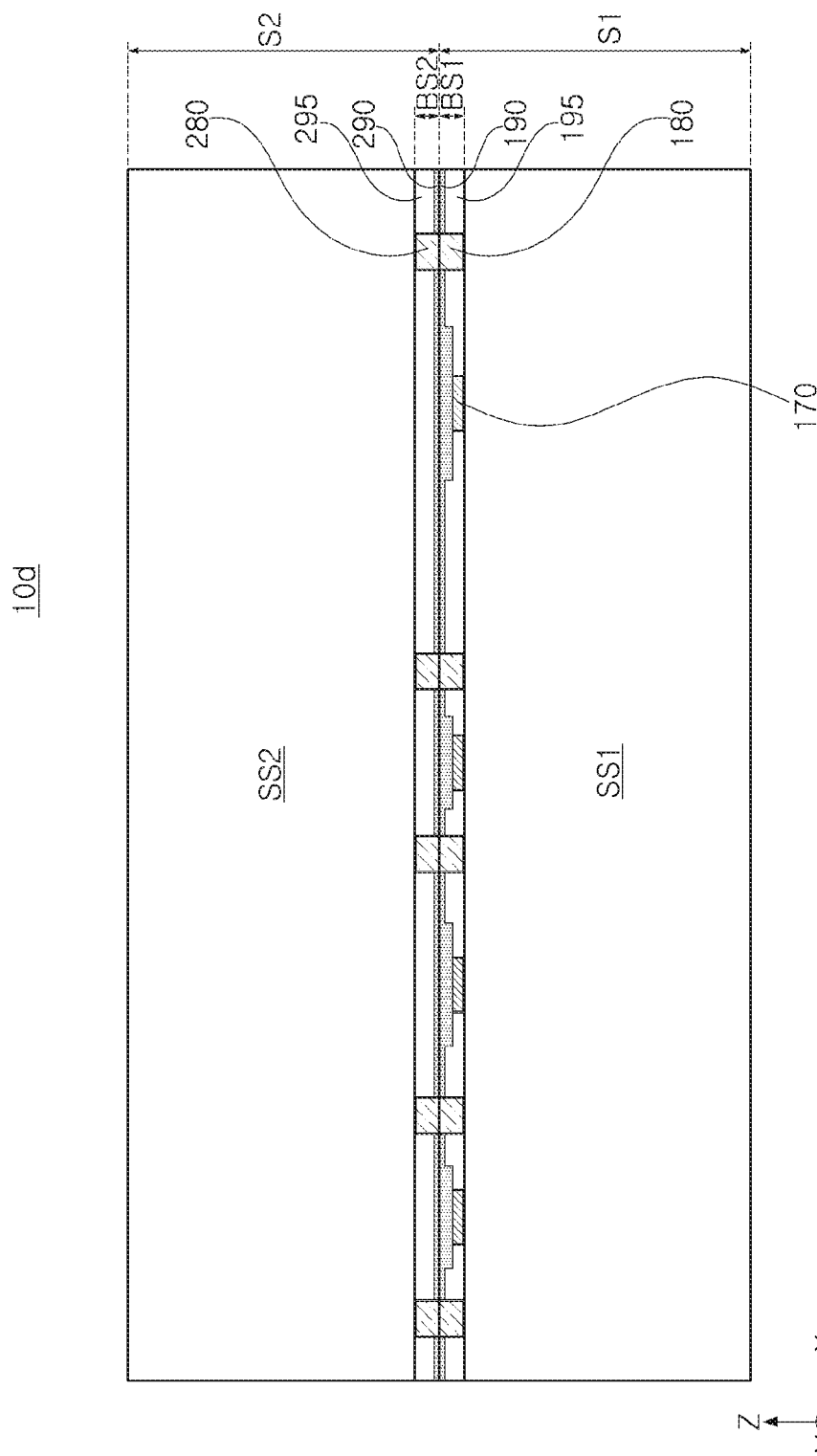

FIGS. 5A, 5B, and 5C are cross-sectional diagrams illustrating a semiconductor device according to some example embodiments. FIG. 5A illustrates a cross-sectional surface corresponding to FIG. 2B.

Referring to FIG. 5A, a semiconductor device 10b may further include second metal patterns 270 disposed in a second insulating layer 295 and in contact with a second bonding insulating layer 290 in a second bonding structure BS2, differently from the semiconductor device 10a illustrated in FIGS. 2A and 2B. Each of the second metal patterns 270 may have a width smaller than a width of each of the second bonding pads 280 in one direction, an x direction, for example, and the second metal patterns 270 may be covered by the second bonding insulating layer 290 such that lower surfaces 270b thereof may not exposed. Accordingly, as shown in at least FIG. 5A, the lower surfaces 270b of the second metal patterns 270 may be at a higher level than (e.g., distal to the lower surface S1b in the Z-direction in relation to) lower surfaces 280b of the second bonding pads 280. The second bonding insulating layer 290 may include a conductive material, such as copper (Cu), tungsten (W), aluminum (Al), tungsten nitride (WN), tantalum nitride (TaN), titanium nitride (TiN), or a combination thereof, for example. The second metal patterns 270 may be electrically connected to a cell array region disposed in the second substrate structure SS2, and may be used for input and output wirings, but some example embodiments thereof are not limited thereto.

As illustrated in FIG. 3, a width d3 of each of the first metal patterns 170 may be less than a width d2 of each of the first bonding pads 180 such that, when the first and second metal patterns 170 and 270 are exposed at bonding surfaces of the first and second structures S1 and S2, it may be difficult to align and dispose the first and second metal patterns 170 and 270. Also, as the first and second metal patterns 170 and 270 may extend further than the first and second bonding pads 180 and 280, when the first and second metal patterns 170 and 270 are exposed at the bonding surfaces of the first and second structures S1 and S2, a ratio of non-bonding on the bonding surfaces of the first and second structures S1 and S2 may increase further than the example in which only the first and second bonding pads 180 and 280 are bonded by copper (Cu) to copper (Cu) bonding. Accordingly, reliability of electrical connection between the first and second structures S1 and S2 may be reduced. However, when the first and second bonding insulating layers 190 and 290 have a different thickness between the first region A and the second region B in the first and second structures S1 and S2, respectively, as the first and second metal patterns 170 and 270 used for input and output wirings may not be exposed at the bonding surfaces of the first and second structures S1 and S2, reliability of electrical connection by the bonding between the first and second structures S1 and S2 may improve.

The second metal patterns 270 may include a barrier metal layer BM similarly to the first metal patterns 170. The barrier metal layer BM may be disposed to cover an upper portion and a lateral surface of each of the second metal patterns 270. The barrier metal layer BM may prevent a conductive material of the second metal patterns 270 from being diffused. The barrier metal layer BM may include one of Ta, TaN, Ti, or TiN, but some example embodiments thereof are not limited thereto.

Whether to dispose the first and second metal patterns 170 and 270 may be varied in some example embodiments, For example, differently from the example in FIGS. 2B and 5A, the first bonding structure BS1 may not include the first metal patterns 170, and the second bonding structure BS2 may include the second metal patterns 270.

Referring to FIG. 5B, in a semiconductor device 10c, dispositional relationship between the first bonding pads 180 and the first metal patterns 170 may be different from that of the semiconductor device 10*a* illustrated in FIGS. 2A and 2B. For example, the first bonding structure BS1 of the semiconductor device 10*c* may be divided into a region in which the first bonding pads 180 are consecutively disposed and a region in which the first metal patterns 170 are consecutively disposed.

Referring to FIG. 5C, a width of each of the first metal patterns 170 may be greater than a width of each of the first bonding pads 180, differently from the example illustrated in FIGS. 2B and 3.

FIGS. 6, 7, 8, 9A, and 9B are cross-sectional diagrams illustrating a portion of a semiconductor device according to some example embodiments. FIGS. 6 to 9B illustrate regions corresponding to region "A" and region "B." As shown FIGS. 6, 7, 8, 9A, and 9B, a level (e.g., distance from the lower surface S1B in the Z-direction) of a first lowermost surface 190B=190L1 of the first bonding insulating layer 190 in the first region A is the same as a level (e.g., distance from the lower surface S1B in the Z-direction) of a second lowermost surface 190B=190L2 of the first bonding insulating layer 190 in the second region B. As shown in 6, 7, 8, 9A, and 9B, a level (e.g., distance from the lower surface S1B in the Z-direction) of the upper surfaces 170S of the first metal patterns 170 is higher than the level (e.g., distance from the lower surface S1B in the Z-direction) of the first and second lowermost surfaces 190B=190L1/190L2 of the first bonding insulating layer 190 (e.g., the distance of the upper surfaces 170S of the first metal patterns 170 from the lower surface S1B in the Z-direction is greater than the distance of the first and second lowermost surfaces 190B=190L1/190L2 of the first bonding insulating layer 190 from the lower surface S1B in the Z-direction).

Figure 6:
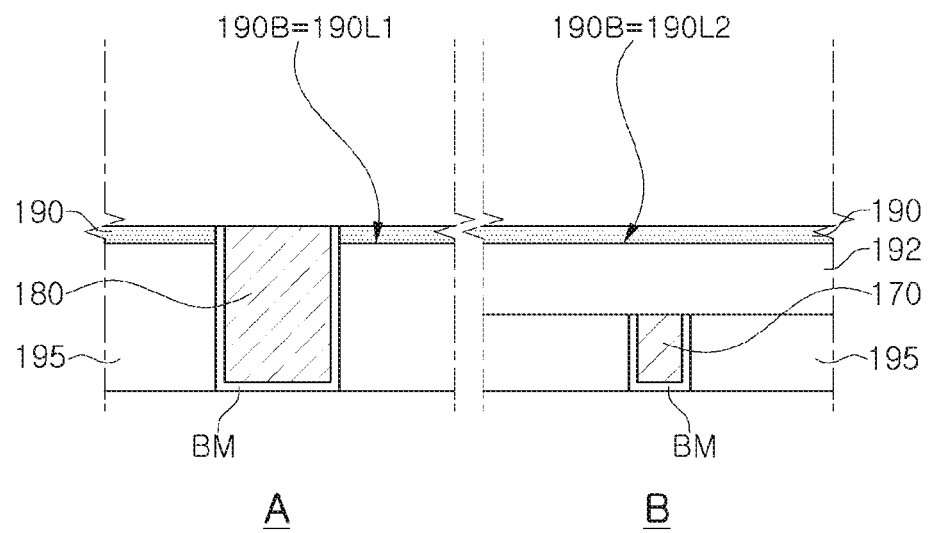
FIGS. 6, 7, 8, 9A, and 9B are cross-sectional diagrams illustrating a portion of a semiconductor device according to some example embodiments of the inventive concepts.

Referring to FIG. 6, the first bonding insulating layer 190 may have a first region A penetrated by the first bonding pad 180 and a second region B in contact with the first metal pattern 170. In the first region A and the second region B, an upper surface of the first bonding insulating layer 190 may be coplanar and a lower surface of the first bonding insulating layer 190 may be disposed on a different level. The first bonding structure BS1 may further include an intermediate insulating layer 192 disposed between (e.g., directly between) the first bonding insulating layer 190 and the first metal patterns 170 in at least one region (e.g., the second region B) of the first bonding insulating layer 190 (e.g., the intermediate insulating layer 192 may vertically overlap, in the Z-direction, the second region B of the first bonding insulating layer 190 and not the first region A of the first bonding insulating layer 190. The intermediate insulating layer 192 may be formed of (e.g., may at least partially comprise) an insulating material such as silicon oxide, and may be formed of a material different from a material of the first bonding insulating layer 190 (e.g., may have a different total material composition than the first bonding insulating layer).

Figure 7:
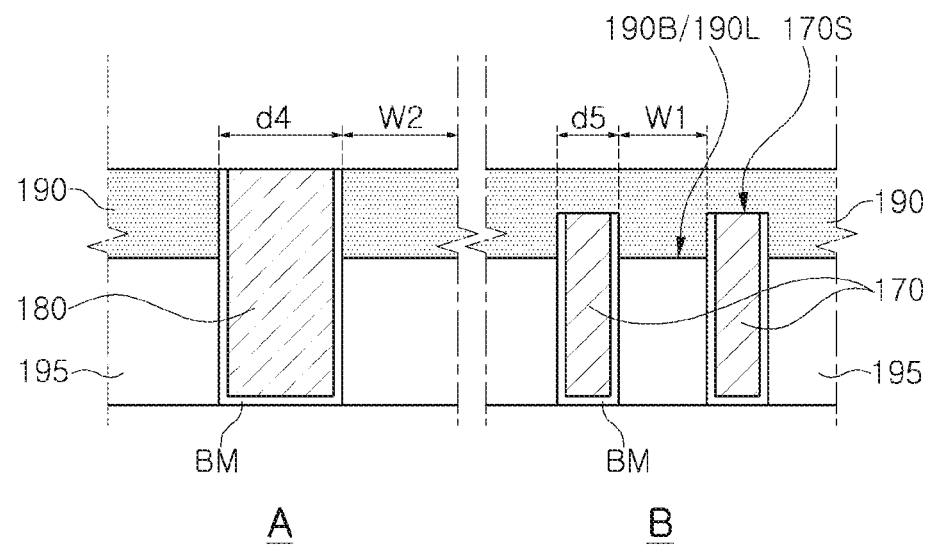

Referring to FIG. 7, the first bonding insulating layer 190 may have a first region A penetrated by the first bonding pad 180 and a second region B in contact with the first metal pattern 170. A gap W1 between the first metal patterns 170 in the second region B may be narrower than a gap between the first bonding pads 180 or a second gap W2 between the first bonding pad 180 and the other pattern including the first metal patterns 170 in the first region A, and as illustrated in the diagram, a width d5 of the first metal pattern 170 may be less than a width d4 of the first bonding pad 180, but some example embodiments thereof are not limited thereto. A thickness of the first bonding insulating layer 190 in the first region A may be substantially the same as or similar to a thickness of the first bonding insulating layer 190 disposed on a circumference of the first metal pattern 170 in the second region B, and upper surfaces of the first metal patterns 170 in the second region B in which a gap between the first metal patterns 170 is relatively small may be placed at a higher level than a lower surface of the first bonding insulating layer 190. In the second region B, upper surfaces of the first metal patterns 170 may be placed at a higher level than a lower surface 190B of the first bonding insulating layer 190 (e.g., the upper surfaces 170S of the first metal patterns 170 may be further from the lower surface S1*b* of the first structure S1 in the Z-direction than a lowermost surface 190L of the first bonding insulating layer 190, where the lowermost surface 190L is a portion of the lower surface 190B that is closest to the lower surface S1*b* in the Z-direction), but some example embodiments thereof are not limited thereto.

Figure 8:
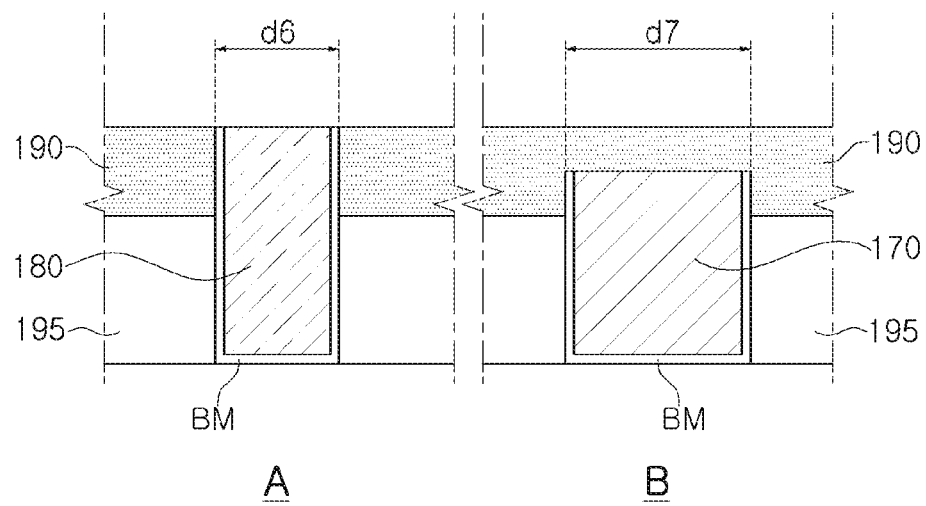

Referring to FIG. 8, the first bonding insulating layer 190 may have a first region A penetrated by the first bonding pad 180 and a second region B in contact with the first metal pattern 170. A width d7 of the first metal pattern may be wider than a width d6 of the first bonding pad 180. A thickness of the first bonding insulating layer 190 in the first region A may be substantially the same as or similar to a thickness of the first bonding insulating layer 190 disposed on a circumference of the first metal pattern 170 in the second region B, and upper surfaces of the first metal patterns 170 may be placed at a higher level than a lower surface of the first bonding insulating layer 190.

Figure 9A:
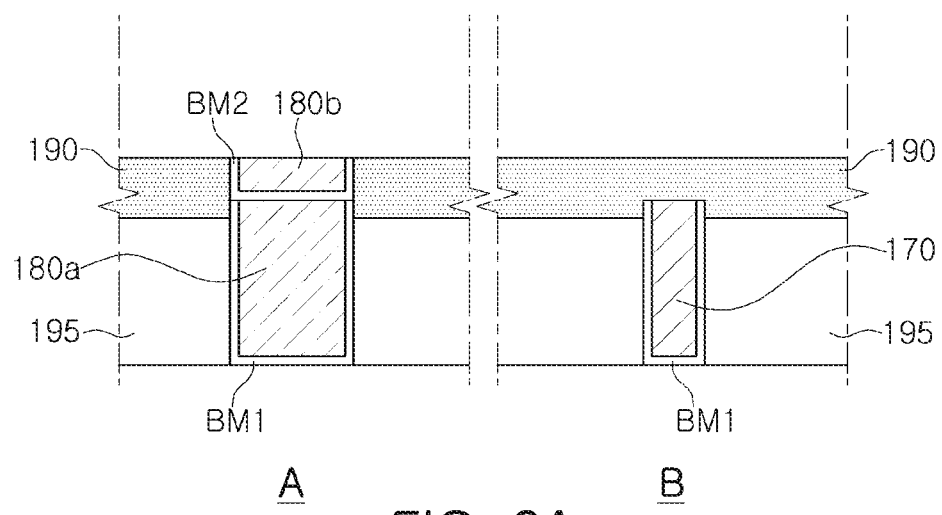

Referring to FIG. 9A, the first bonding insulating layer 190 may have a first region A penetrated by the first bonding pad 180 and a second region B in contact with the first metal pattern 170. As shown in FIG. 9A, the first bonding pad 180 may include a first conductive layer 180*a*, a first barrier metal layer BM1 covering a lower surface and a lateral surface of the first conductive layer 180*a*, a second conductive layer 180*b* disposed on (e.g., indirectly on) the first conductive layer 180*a*, and a second barrier metal layer BM2 covering a lower surface and a lateral surface of the second conductive layer 180*b* (e.g., at least partially directly between the first and second conductive layers 180*a* and 180*b*). As shown in FIG. 9A, the second barrier metal layer BM2 may cover at least a portion of the upper surface of the first conductive layer 180*a*. The second conductive layer 180*b* and the second barrier metal layer BM2 may be disposed in the first bonding insulating layer 190.

The first conductive layer 180*a* and the first metal patterns 170 (and also conductive layers 180*i* and 170*i*) may include the same conductive material, and may include, for example, copper (Cu), tungsten (W), aluminum (Al), tungsten nitride (WN), tantalum nitride (TaN), Titanium nitride (TiN) or combinations thereof. The second conductive layer 180*b* may include a conductive material the same as or different from the first conductive layer 180*a* and the first metal patterns 170, and may include, for example, copper (Cu).

Thicknesses of the first bonding insulating layer 190 in the first region A and the second region B may be the same or similar to each other. In other words, a thickness of the first bonding insulating layer 190 in the first region A may be substantially the same as or similar to a thickness of the first bonding insulating layer 190 disposed on a circumference of the first metal pattern 170 in the second region B, and upper surfaces of the first metal patterns 170 in the second region B may be placed at a higher level than a lower surface of the first bonding insulating layer 190, but some example embodiments thereof are not limited thereto.

Figure 9B:
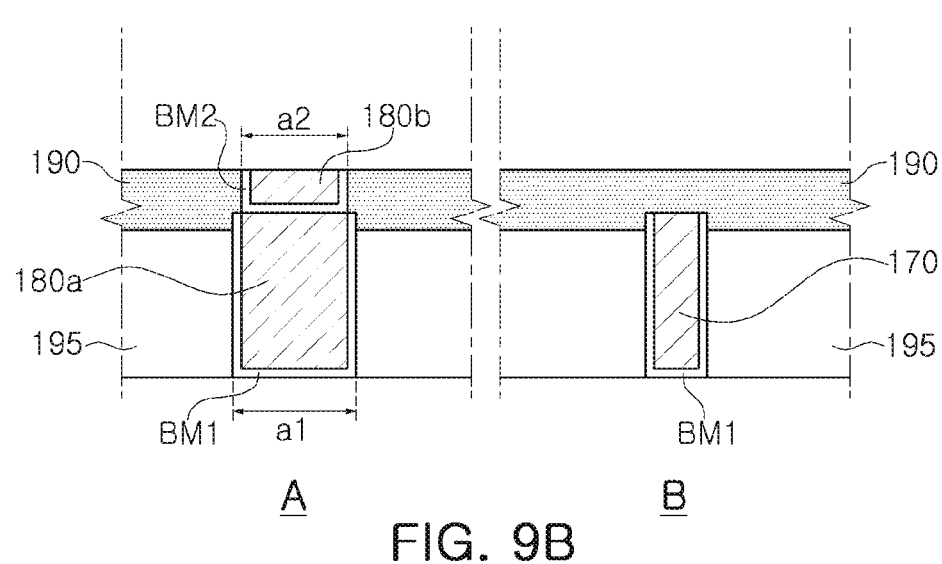

Referring to FIG. 9B, a second width a2 of the first upper bonding pad may be smaller than a first width a1 of the first lower bonding pad, and the second barrier metal layer BM2 may cover a portion (e.g., a limited portion, such that another portion is exposed) of an upper surface of the first conductive layer 180a. In some example embodiments, widths of upper portions and lower portions of the first and second bonding pads 180 and 280 and the first and second metal patterns 170 and 270 may have the same shape, but some example embodiments thereof are not limited thereto. For example, the first bonding pad 180 may have an inclined lateral surface having a width decreasing downwardly.

Figure 10:
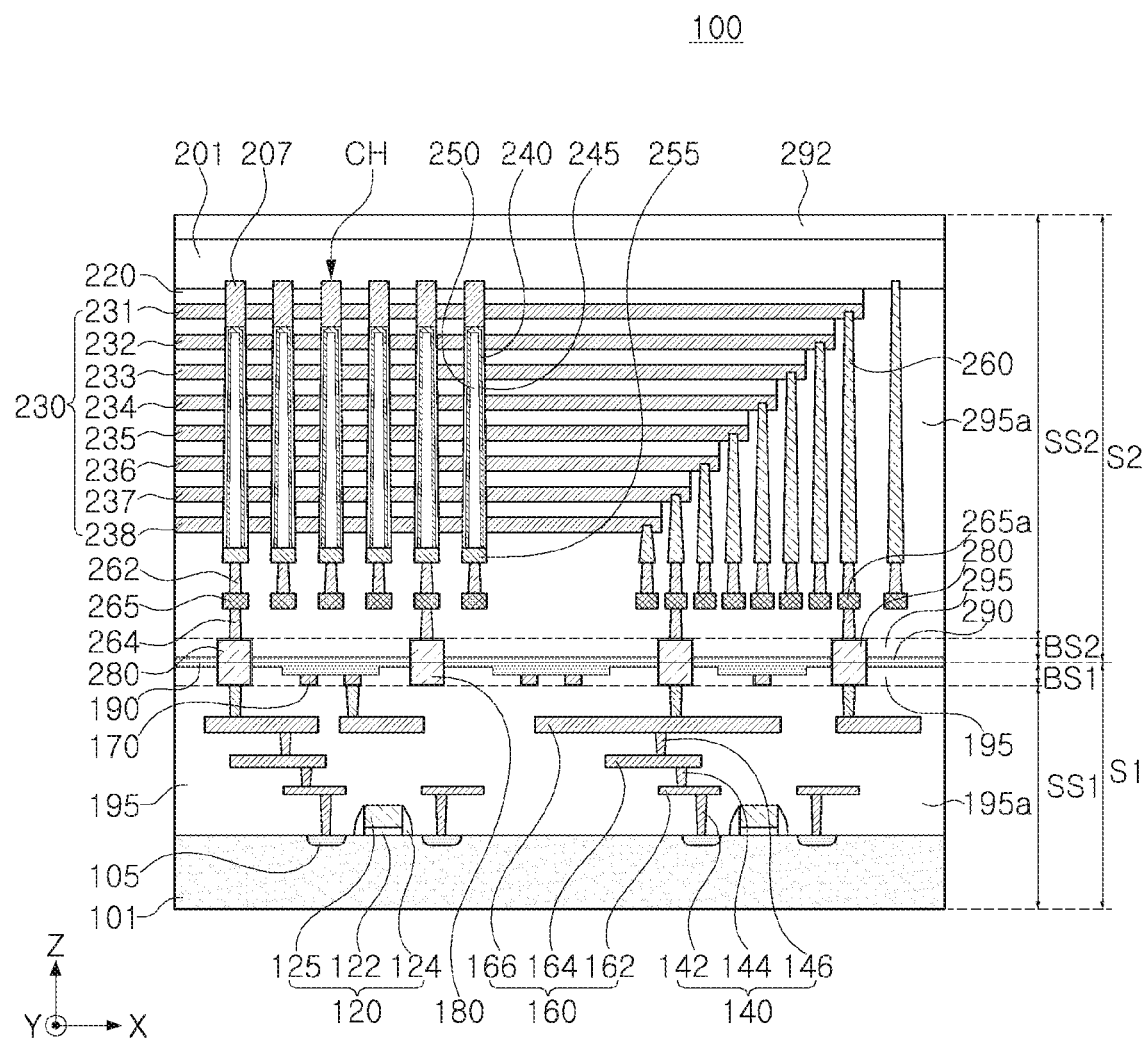
FIG. 10 is a cross-sectional diagram illustrating a semiconductor device according to some example embodiments of the inventive concepts.

FIG. 10 is a cross-sectional diagram illustrating a semiconductor device according to some example embodiments.

Referring to FIG. 10, a semiconductor device may have a first structure S1 and a second structure S2 bonded to each other. The first structure S1 may include a first substrate structure SS1 and a first bonding structure BS1, and the second structure S2 may include a second substrate structure SS2 and a second bonding structure BS2.

The first substrate structure SS1 may include a first substrate 101, circuit devices 120 disposed on the first substrate 101, circuit contact plugs 140, and circuit wiring lines 160. In some example embodiments, the circuit contact plugs 140 and the circuit wiring lines 160 may be collectively referred to as wiring layers that electrically connect the first bonding pads 180 and first metal patterns 170 to the plurality of circuit devices 120.

The first substrate 101 may have an upper surface extending in an x direction and a y direction. In the first substrate 101, device separation layers may be formed such that an active region may be defined. Source/drain regions 105 including impurities may be disposed in a portion of the active region. The first substrate 101 may include a semiconductor material, such as, for example, a group IV semiconductor, a group III-V compound semiconductor, or a group II-VI compound semiconductor. For example, the first substrate 101 may be provided as a single-crystalline bulk wafer.

The circuit devices 120 may include a planar transistor. Each of the circuit devices 120 may include a circuit gate dielectric layer 122, a spacer layer 124, and a circuit gate electrode 125. The source/drain regions 105 may be disposed in the first substrate 101 on both sides of the circuit gate electrode 125.

A peripheral region insulating layer 195a may be disposed on the circuit device 120 on the first substrate 101, and may be formed to be connected to the first insulating layer 195 of the first bonding structure BS1. The circuit contact plugs 140 may penetrate the peripheral region insulating layer 195a and may be connected to the source/drain regions 105 (which may be electrically connected to at least one circuit device 120), and may include first to third circuit contact plugs 142, 144, and 146 disposed in order from the first substrate 101. An electrical signal may be applied to the circuit device 120 by the circuit contact plugs 140. In a region not illustrated in the diagram, the circuit contact plugs 140 may also be connected to the circuit gate electrode 125. The circuit wiring lines 160 (e.g., circuit wiring lines 162, 164, and 166) may be connected to the circuit contact plugs 140, and may include the first to third circuit contact plugs 142, 144, and 146 forming a plurality of layers (e.g., at least partially forming a plurality of wiring layers). The first bonding pads 180 or the first metal patterns 170 of the first bonding structure BS1 may be disposed to be connected to the third circuit contact plugs 146.

The second substrate structure SS2 may include a second substrate 201, gate electrodes 231, 232, 233, 234, 235, 236, 237, and 238 (230), also referred to herein as a plurality of gate electrode layers, stacked on a lower surface of the second substrate 201 and thus between the second substrate 201 and the second bonding structure BS2, interlayer insulating layers 220 alternately stacked with gate electrodes 230, channels CH disposed to penetrate the gate electrodes 230, a cell region insulating layer 295a covering the gate electrodes 230, and a pad insulating layer 292 stacked on an upper surface of the second substrate 201 and disposed on the cell region insulating layer 295a. As shown, the gate electrodes 231 to 238 (23) may be isolated from direct contact with each other (e.g., in the Z-direction). The cell region insulating layer 295a may be configured to be connected to the second insulating layer 295 of the second bonding structure BS2. In some example embodiments, the second substrate structure SS2 may include NAND memory cells, but some example embodiments thereof are not limited thereto. In some example embodiments, the second substrate structure SS2 may include a volatile memory such as a dynamic random access memory (DRAM), a static random access memory (SRAM), or the like, and various non-volatile memory devices.

The second substrate structure SS2 may further include channel regions 240, gate dielectric layers 245, channel insulating layers 250, and channel pads 255, disposed in the channels CH. Some or all of the channel regions 240, gate dielectric layers 245, channel insulating layers 250, and channel pads 255 and/or epitaxial layer 207, disposed in a given channel CH, may be collectively referred to as a channel structure that penetrates some or all of the gate electrodes 231 to 238 (230). The second substrate structure SS2 may be configured as a wiring structure, and may further include cell contact plugs 260 applying a signal to the gate electrodes 230 and the second substrate 201, first conductive plugs 262, bit lines 265 and 265a, and second conductive plugs 264.

The second substrate 201 may have a lower surface extending in an x direction and a y direction. The second substrate 201 may include a semiconductor material, such as, for example, a group IV semiconductor, a group III-V compound semiconductor, or a group II-VI compound semiconductor. For example, a group IV semiconductor may include silicon, germanium, silicon-gallium, or the like. For example, the second substrate 201 may be provided as a polycrystalline layer or an epitaxial layer. The second substrate 201 may include a doped region including impurities.

The gate electrodes 230 may be vertically stacked on a lower surface of the second substrate 201 and may be spaced apart from each other, and may form a stack structure with the interlayer insulating layers 220. The gate electrodes 230 may include a lower gate electrode 231, memory gate electrodes 232 to 236 forming a plurality of memory cells MC, and upper gate electrodes 237 and 238. The number of the memory gate electrodes 232 to 236 included in the memory cells MC may be determined depending on capacity of a semiconductor device 10. In some example embodiments, the number of each of the upper and lower gate electrodes 231, 237, and 238 may be one or two, and each of the upper and lower gate electrodes 231, 237, and 238 may have a structure the same as or different from structures of the gate electrodes 230 of the memory cells MC. A portion of the memory cells MC, the memory gate electrodes 232 and 236 adjacent to the upper and lower gate electrodes 231, 237, and 238, for example, may be dummy gate electrodes.

The gate electrodes 230 may be vertically stacked on a lower surface of the second substrate 201 and may be spaced apart from each other, and may extend in at least one direction by different lengths and may form stepped portions in staircase form. The gate electrodes 230 may form the stepped portions in the x direction as illustrated in FIG. 8, and may also form stepped portions in the y direction. By the stepped portions, a certain region of the gate electrodes 230 including ends of the gate electrodes 230 may be exposed. The gate electrodes 230 may be connected to the cell contact plugs 260 in the region described above.

The gate electrodes 230 may be divided in the y direction by a separation region not illustrated in the diagram by a certain unit. The gate electrodes 230 may form a single memory block between a pair of separation regions, but an example range of the memory block are not limited thereto. A portion of the gate electrodes 230, the memory gate electrodes 232 to 236, for example, may form a single layer in a single memory block.

The interlayer insulating layers 220 may be disposed between the gate electrodes 230. The interlayer insulating layers 220 may be spaced apart from each other in a direction perpendicular to a lower surface of the second substrate 201 and may extend in the x direction, similarly to the gate electrodes 230. The interlayer insulating layers 220 may include an insulating material such as silicon oxide or silicon nitride.

The channels CH may be disposed on a lower surface of the second substrate 201 while forming rows and columns and may be spaced apart from each other. The channels CH may be disposed to form a lattice pattern or may be disposed in zigzag pattern in one direction. The channels CH may have a cylindrical shape, and may have an inclined lateral surface having a width decreasing towards the second substrate 201 depending on an aspect ratio. In some example embodiments, a portion of the channels CH may be configured as dummy channels, and additional dummy channels may be disposed on an external side of the channels CH.

A channel region 240 may be disposed in the channels CH. The channel region 240 in the channels CH may be configured to have an annular shape surrounding the channel insulating layer 250 disposed therein, and in some example embodiments, the channel insulating layer 250 may also have a columnar shape such as a cylindrical shape or a prism shape. The channel region 240 may be connected to an epitaxial layer 207 on an upper portion thereof. The channel region 240 may include a semiconductor material such as polycrystalline silicon or single crystalline silicon, and the semiconductor material may be implemented as an undoped material or a material including p-type or n-type impurities.

The channel pads 255 may be disposed on an upper portion of the channel region 240 in the channel CH. The channel pads 255 may be disposed to cover an upper surface of the channel insulating layer 250 and to be electrically connected to the channel region 240. The channel pads 255 may include, for example, doped polycrystalline silicon.

The gate dielectric layer 245 may be disposed between the gate electrodes 230 and the channel region 240. Although not illustrated in detail in the diagram, the gate dielectric layer 245 may include a tunneling layer, an electric charge storage layer, and a blocking layer, stacked in order from the channel region 240. The tunneling layer may tunnel electric changes to the electric charge storage layer, and may include, for example, silicon oxide (SiO2), silicon nitride (Si3N4), silicon oxynitride (SiON), or a combination thereof. The electric charge storage layer may be configured as an electric charge trap layer or a floating gate conductive layer. The blocking layer may include silicon oxide (SiO2), silicon nitride (Si3N4), silicon oxynitride (SiON), a high-k dielectric material, or a combination thereof. In some example embodiments, at least a portion of the gate dielectric layers 245 may extend in a horizontal direction along the gate electrodes 230.

The epitaxial layer 207 may be disposed on a lower surface of the second substrate 201 on upper ends of the channels CH, and may be disposed on a lateral surface of at least one gate electrode 230. The epitaxial layer 207 may be disposed in a recessed region of the second substrate 201. A level of a lower surface of the epitaxial layer 207 may be lower than a level of a lower surface of an uppermost gate electrode 231 and may be higher than a level of an upper surface of a memory gate electrode 232 disposed below the uppermost gate electrode 231, but some example embodiments thereof are not limited thereto. In some example embodiments, the epitaxial layer 207 may not be provided, and in this case, the channel region 240 may be directly connected to the second substrate 201 or may be connected to a conductive layer disposed on the second substrate 201.

The second substrate structure SS2 may further include cell contact plugs 260, first conductive plugs 262, bit lines 265 and 265a, and second conductive plugs 264, which are wiring structure for electrical connection with the first substrate structure SS1. The wiring structures may include a conductive material. The wiring structures may include, for example, tungsten (W), aluminum (Al), copper (Cu), tungsten nitride (WN), tantalum nitride (TaN), titanium nitride (TiN), or a combination thereof.

The cell contact plugs 260 may be disposed on the second substrate 201, may penetrate the cell region insulating layer 295a, and may be connected to the gate electrodes 230 and the second substrate 201. The cell contact plugs 260 may be connected to the first conductive plugs 262 on lower ends thereof. Each of the cell contact plugs 260 may have a cylindrical shape. In some example embodiments, each of the cell contact plugs 260 may have an inclined lateral surface having a width decreasing towards the second substrate 201 depending on an aspect ratio. In some example embodiments, a portion of the cell contact plugs 260 may be configured as dummy contact plugs to which an electrical signal is not applied.

The first conductive plugs 262 may be disposed on lower ends of the channels CH and the cell contact plugs 260. The bit lines 265 and 265a may be disposed between the first and second conductive plugs 262 and 264 on lower ends of the first conductive plugs 262. The bit lines 265 and 265a may include the bit lines 265 connected to the channels CH and the bit lines 265a connected to the cell contact plugs 260. The bit lines 265a connected to the cell contact plugs 260 may be wiring lines which may be formed on the same level as a level of the bit lines 265 connected to the channels CH in the same process. The bit lines 265a connected to the cell contact plugs 260 may be disposed on a lower portion of each of the first conductive plugs 262, but some example embodiments thereof are not limited thereto. The second conductive plugs 264 may be disposed on lower portions of the bit lines 265 and 265a, and may be connected to second bonding pads 280 of the second bonding structure BS2.

In FIG. 10, the first bonding structure BS1 and the second bonding structure BS2 may be illustrated according to some example embodiments illustrated in FIGS. 2B and 3, but some example embodiments thereof are not limited thereto, and some example embodiments illustrated in FIGS. 6 to 9B may also be applied to a portion or an entirety of the first and second bonding structures BS1 and BS2.

FIGS. 11A, 11B, 11C, 11D, 11E, and 11F are cross-sectional diagrams illustrating a method of manufacturing a semiconductor device according to some example embodiments.

FIGS. 11A to 11F illustrate a cross-sectional surface corresponding to FIG. 3.

Figure 11A:
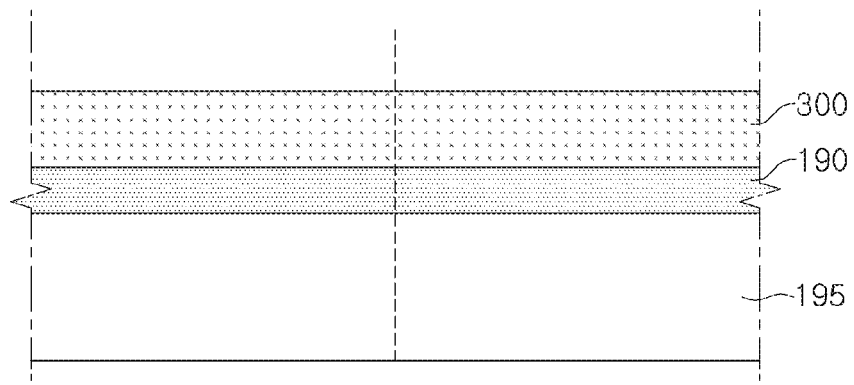
FIGS. 11A, 11B, 11C, 11D, 11E, and 11F are cross-sectional diagrams illustrating a method of manufacturing a semiconductor device according to some example embodiments of the inventive concepts.

Referring to FIG. 11A, a first insulating layer 195, a first bonding insulating layer 190, and a photosensitive resin layer 300 used as a mask pattern, may be formed in order on a first substrate structure SS1 (see FIG. 2B).

Figure 11B:
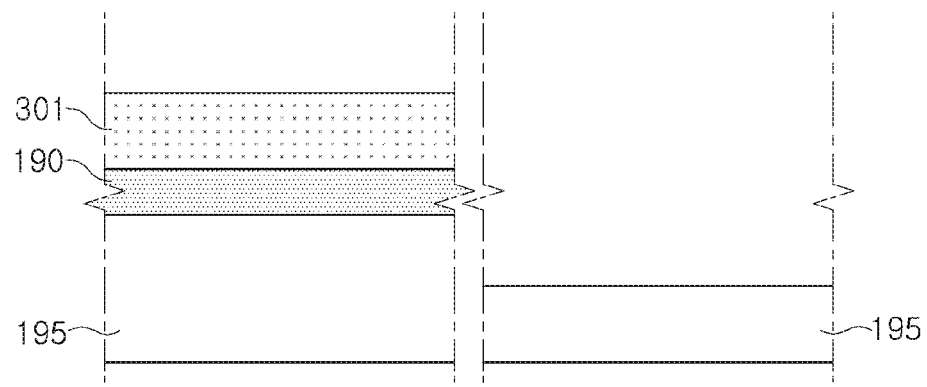

Referring to FIG. 11B, a first mask pattern 301 having an opening for exposing partial regions of the first bonding insulating layer 190 may be formed by performing a photolithography process on the photosensitive resin layer 300, and the first insulating layer 195 and the first bonding insulating layer 190 may be partially etched using the first mask pattern 301 as an etching mask. A region from which the first bonding insulating layer 190 is not removed may correspond to the first region A illustrated in FIGS. 3 and 6. An upper surface of the first bonding insulating layer 190 in the first region A may be covered by the first mask pattern 301. The region from which the first insulating layer 195 and the first bonding insulating layer 190 are partially removed may correspond to the second region B illustrated in FIGS. 3 and 6. The first insulating layer 195 and the first bonding insulating layer 190 may be partially etched using the first mask pattern 301 as an etching mask such that a stepped portion of the first insulating layer 195 may be formed between the first region A and the second region B. A photolithography process performed on the photosensitive resin layer 300 to form a stepped portion of the first insulating layer 195 may be performed for division of a region, rather than for structure patterning, and thus, the photolithography process may be performed using a lithography facility using a wavelength relatively longer than a wavelength used by a photolithography facility for structure patterning.

Figure 11C:
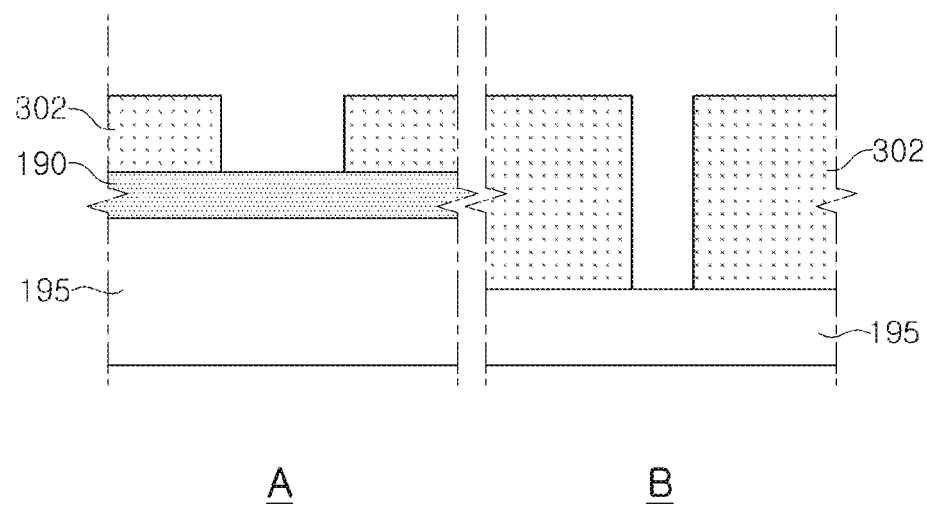

Referring to FIG. 11C, an additional photosensitive resin layer may be formed, and a photolithography process may be performed to form a second mask pattern 302. The second mask pattern 302 formed on the first bonding insulating layer 190 in the first region may be configured to be wider than the second mask pattern 302 formed on the first insulating layer 195 in the second region.

Figure 11D:
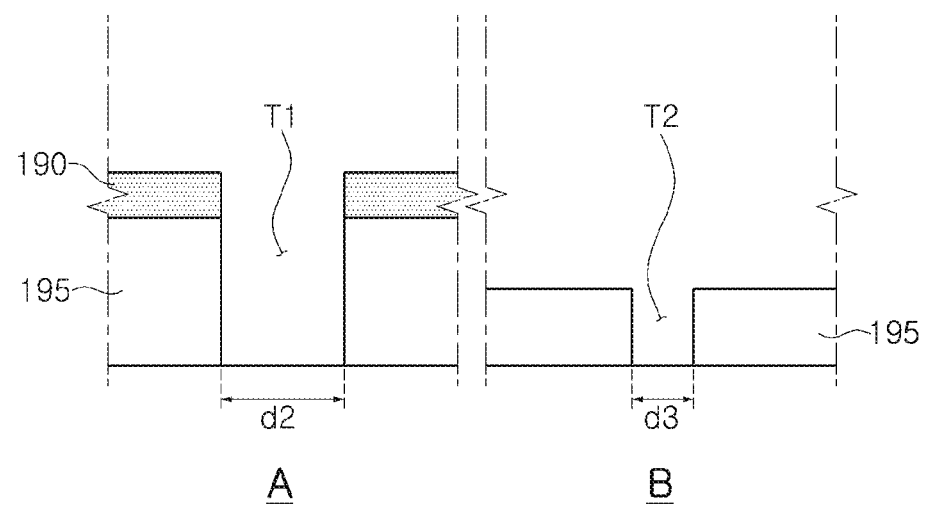

Referring to FIG. 11D, first and second trenches T1 and T2 may be formed on the first bonding insulating layer 190 and the first insulating layer 195 using the second mask pattern 302. A width d2 of the first trench T1 may be wider than a width d3 of the second trench T2. The first trench T1 may be formed in the first bonding insulating layer 190 and at least a portion of the first insulating layer 195 in the first region A, and the second trench T2 may be formed in the first insulating layer 195 in the second region B. In an anisotropic etching process, an upper portion of each of the first and second trenches T1 and T2 may have a width wider than that of the second mask pattern 302. The first and second trenches T1 and T2 may be formed such that each of the first bonding insulating layer 190 and the first insulating layer 195 may have an inclined lateral wall. After the first and second trenches T1 and T2 are formed, a process for removing the second mask pattern 302 may be performed.

Figure 11E:
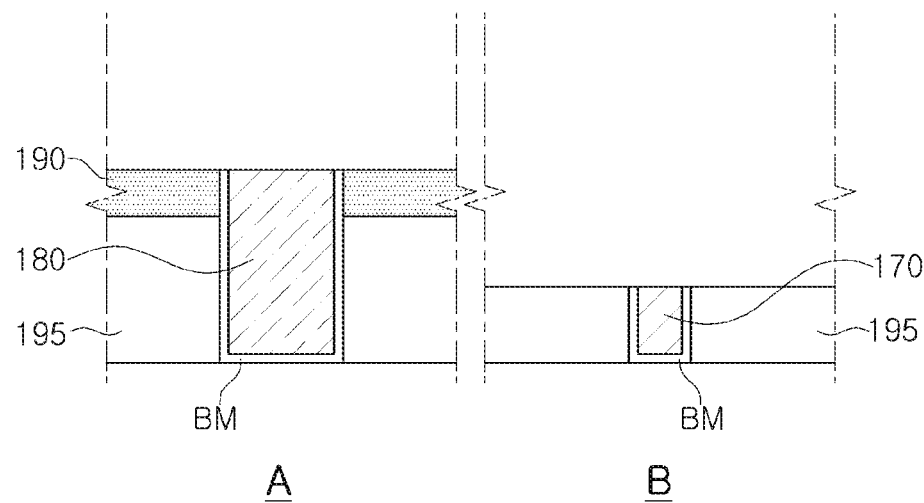

Referring to FIG. 11E, a barrier metal layer BM may be formed on an internal wall of each of the first and second trenches T1 and T2, and the first bonding pad 180 and the first metal pattern 170 may be formed. The barrier metal layer BM may be formed by a chemical vapor deposition (CVD) method, an atomic layer deposition (ALD) method, or a physical vapor deposition (PVD) method such as a sputtering method. The barrier metal layer BM may be one material selected from among Ta, TaN, TaSiN, Ti, TiN, TiSiN, W, WN or a combination thereof. Thereafter, the first and second trenches T1 and T2 in which the barrier metal layer BM is formed may be filled with a conductive material. The conductive material may include, for example, Cu, or alloys thereof. After the barrier metal layer BM is formed, a process for filling a conductive material may be performed simultaneously such that a process for forming the first bonding pad 180 and the first metal pattern 170 may be easily performed. A planarization process for the first and second trenches T1 and T2 filled with a conductive material and the barrier metal layer BM may be performed to form the first bonding pad 180 and the first metal pattern 170. An upper surface of the first bonding pad 180 in the first region A may be exposed, and an upper surface of the first metal pattern 170 and an upper surface of the first insulating layer 195 in the second region B may be exposed. In some example embodiments, as the planarization process, a chemical mechanical polishing (CMP) process may be used.

Figure 11F:
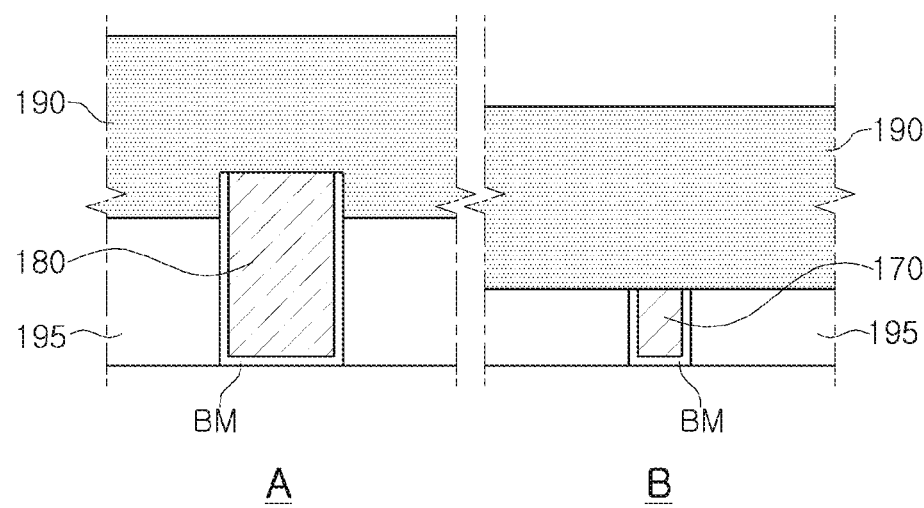

Referring to FIG. 11F, an insulating material the same as that of the first bonding insulating layer 190 may be further deposited on the first bonding pad 180 and the first bonding insulating layer 190 in the first region A and the first metal pattern 170 and the first insulating layer 195 in the second region B. As a stepped portion may be formed in the first insulating layer 195 between the first region A and the second region B, a level of an upper surface of the first bonding insulating layer 190 on which an insulating material is further deposited may be different in the first and second regions A and B.

Referring back to FIG. 3, the first bonding structure BS1 may be formed by performing a planarization process. In the planarization process, an upper surface of the first bonding pad 180 in the first region A may be exposed, and an upper surface of the first metal pattern 170 in the second region B may not be exposed.

FIGS. 12A, 12B, 12C, and 12D are cross-sectional diagrams illustrating a method of manufacturing a semiconductor device according to some example embodiments.

FIGS. 12A to 12D illustrate a cross-sectional surface corresponding to FIG. 7.

Figure 12A:
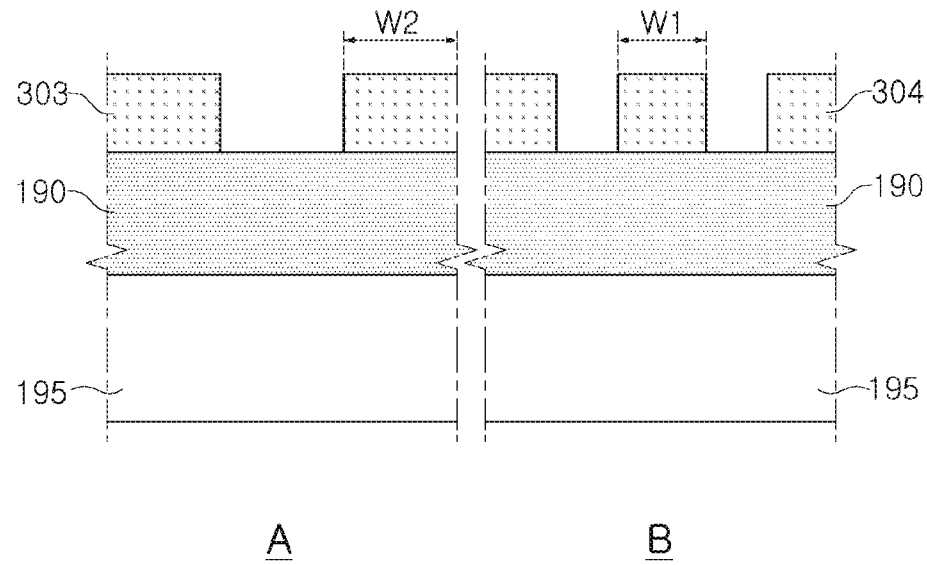
FIGS. 12A, 12B, 12C, and 12D are cross-sectional diagrams illustrating a method of manufacturing a semiconductor device according to some example embodiments of the inventive concepts.

Referring to FIG. 12A, a third mask pattern 303 and a fourth mask pattern 304 for partially exposing a first region and a second region may be formed by performing a photolithography process on the photosensitive resin layer 300 illustrated in FIG. 11A. The third mask patterns 303 formed with a relatively narrow gap may be formed in the second region B, and the fourth mask patterns 304 formed with a relatively wide gap may be formed in the first region A.

Figure 12B:
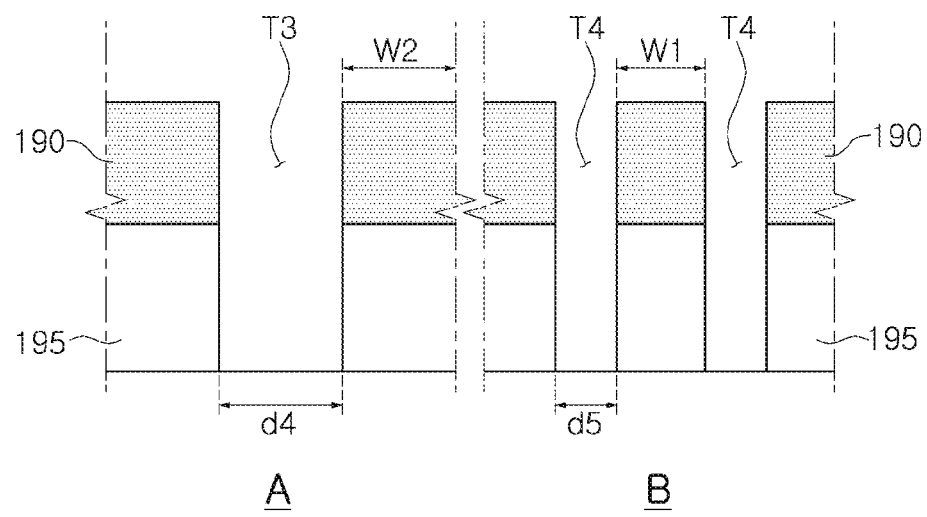

Referring to FIG. 12B, a third trench T3 and a fourth trench T4 may be formed in the first region A and the second region B, respectively, by performing an etching process using the third and fourth mask patterns 303 and 304 as etching masks. The third and fourth trenches T3 and T4 may be formed in the first bonding insulating layer 190 and at least a portion of the first insulating layer 195. A gap W1 between the fourth trenches T4 in the second region B may be narrower than a gap W2 between the third trenches T3 in the first region A.

Figure 12C:
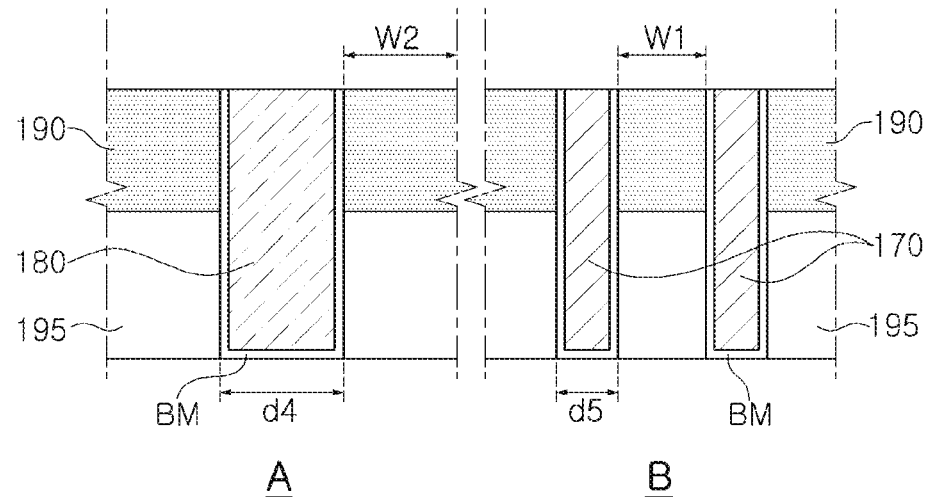

Referring to FIG. 12C, a barrier metal layer BM may be formed on each of internal walls of the third and fourth trenches T3 and T4. Thereafter, the third and fourth trenches T3 and T4 in which the barrier metal layer BM is formed may be filled with a conductive material. The conductive material may be, for example, Cu. Thereafter, the first bonding pad 180 and the first metal pattern 170 may be formed by performing a planarization process. In some example embodiments, as a planarization process, a chemical mechanical polishing (CMP) process may be used.

Figure 12D:
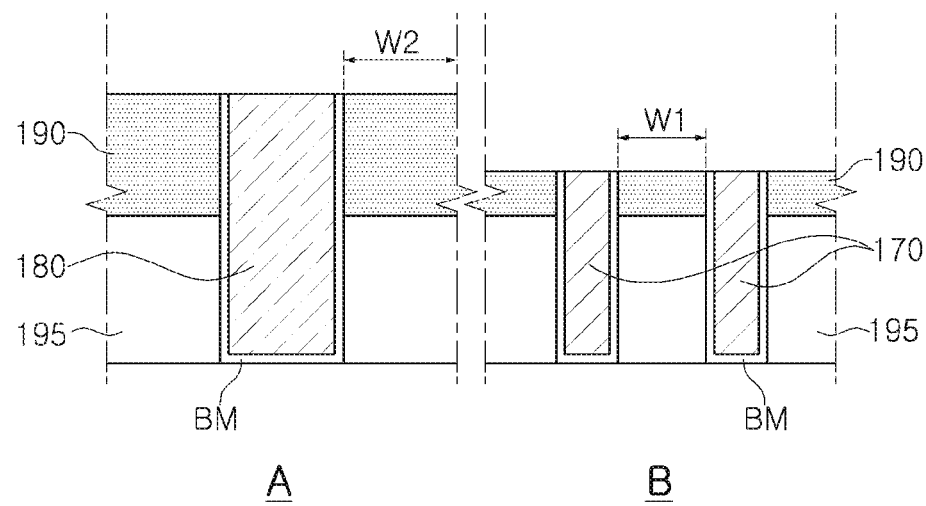

Referring to FIG. 12D, the conductive material layer of the first metal pattern 170 in the second region B may be formed to be further recessed than the conductive material layer of the first bonding pad 180 in the first region A. When an additional CMP process is performed after the first bonding pad 180 and the first metal pattern 170 in FIG. 12C are formed, a region in which density between patterns is relatively low may be ground further than a region in which density between patterns is less low such that the first metal pattern 170 may be recessed further in the second region B in which the first gap W1 between the first metal patterns 170 in the second region B is narrower than a gap between the first bonding pads 180 or the second gap W2 between the first bonding pads 180 and the other pattern including the first metal patterns 170 in the first region A.

Referring back to FIG. 7, after the process in FIG. 12D, an insulating material the same as that of the first bonding insulating layer 190 may be further deposited on the first bonding pad 180 and the first bonding insulating layer 190 in the first region A and the first metal pattern 170 and the first bonding insulating layer 190 in the second region B, and through a planarization process, an upper surface of the first bonding pad 180 in the first region A may be exposed, and an upper surface of the first metal pattern 170 in the second region B may not be exposed. The planarization process may be performed by a CMP process.

Figure 13A:
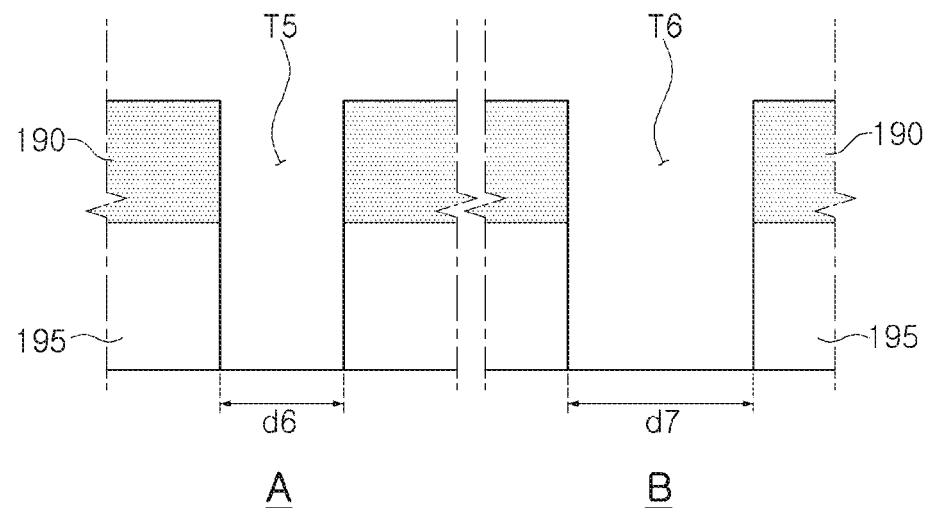
FIGS. 13A, 13B, and 13C are cross-sectional diagrams illustrating a method of manufacturing a semiconductor device according to some example embodiments of the inventive concepts.
Figure 13B:
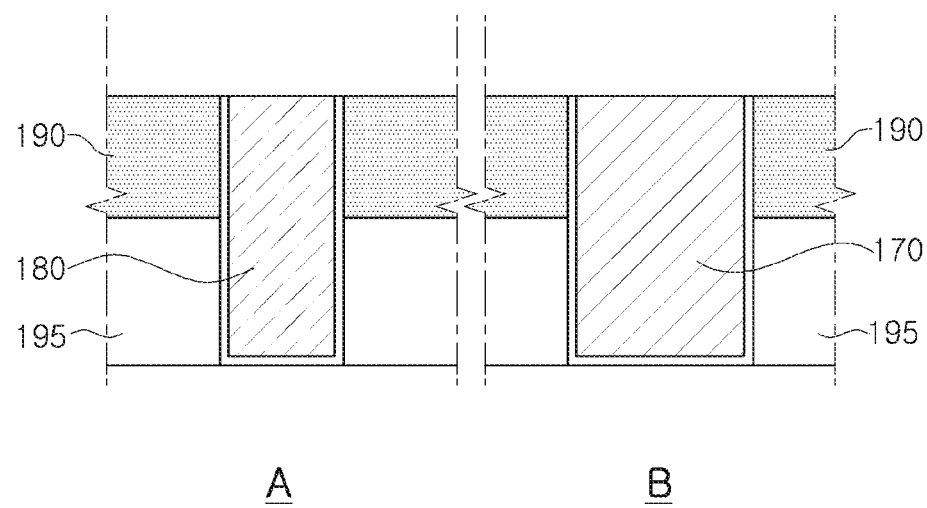
Figure 13C:
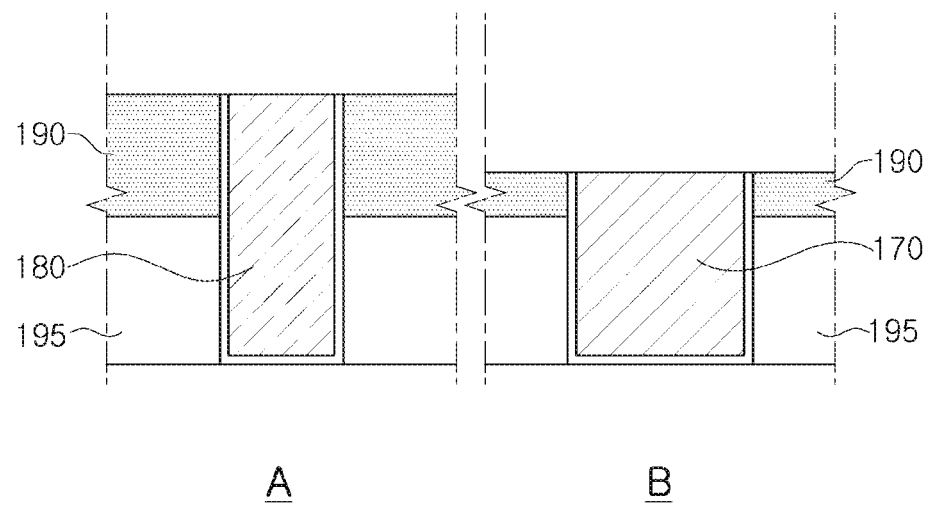

FIGS. 13A, 13B, and 13C are cross-sectional diagrams illustrating a method of manufacturing a semiconductor device according to some example embodiments.

FIGS. 13A to 13C illustrate a cross-sectional surface corresponding to FIG. 8.

Referring to FIG. 13A, a mask pattern for exposing a portion of the first region and a portion of the second region may be formed by performing a photolithography process on the photosensitive resin layer 300 illustrated in FIG. 11A. A fifth trench T5 may be formed in the first region A and a sixth trench T6 may be formed in the second region B by performing an etching process using the mask pattern as an etching mask. The fifth and sixth trenches T5 and T6 may be formed in the first bonding insulating layer 190 and at least a portion of the first insulating layer 195. A width d7 of the sixth trench T6 may be wider than a width d6 of the fifth trench T5.

Referring to FIG. 13B, a barrier metal layer BM may be formed on each of internal walls of the fifth and sixth trenches T5 and T6. Thereafter, the fifth and sixth trenches T5 and T6 in which the barrier metal layer BM is formed may be filled with a conductive material. Thereafter, the first bonding pad 180 and the first metal pattern 170 having a width greater than a width of the first bonding pad 180 may be formed by performing a planarization process.

Referring to FIG. 13C, the conductive material layer of the first metal pattern 170 in the second region B may be formed to be further recessed than the conductive material layer of the first bonding pad 180 in the first region A. When an additional CMP process is performed after the first bonding pad 180 and the first metal pattern 170 are formed in FIG. 13B, a region in which a width of a pattern is wide may be ground further than a region in which a width of a pattern is narrow, and accordingly, the first metal pattern 170 in which a width of a pattern is wider may be recessed further than the first bonding pad 180.

Referring back to FIG. 8, after the process in FIG. 13C, an insulating material the same as that of the first bonding insulating layer 190 may be further deposited on the first bonding pad 180 and the first bonding insulating layer 190 in the first region A and the first metal pattern 170 and the first bonding insulating layer 190 in the second region B, and through a planarization process, an upper surface of the first bonding pad 180 in the first region A may be exposed, and an upper surface of the first metal pattern 170 in the second region B may not be exposed. The planarization process may be performed by a CMP process.

FIGS. 13A to 13C are cross-sectional diagrams illustrating a method of manufacturing a semiconductor device according to some example embodiments.

FIGS. 14A, 14B, 14C, 14D, 14E, 14F, 14G, 14H, and 14I illustrate a region corresponding to FIGS. 9A and 9B. FIGS. 14A, 14B, 14C, 14D, 14E, 14F, 14G, 14H, and 14I are cross-sectional diagrams illustrating a method of manufacturing a semiconductor device according to some example embodiments of the inventive concepts.

Figure 14A:
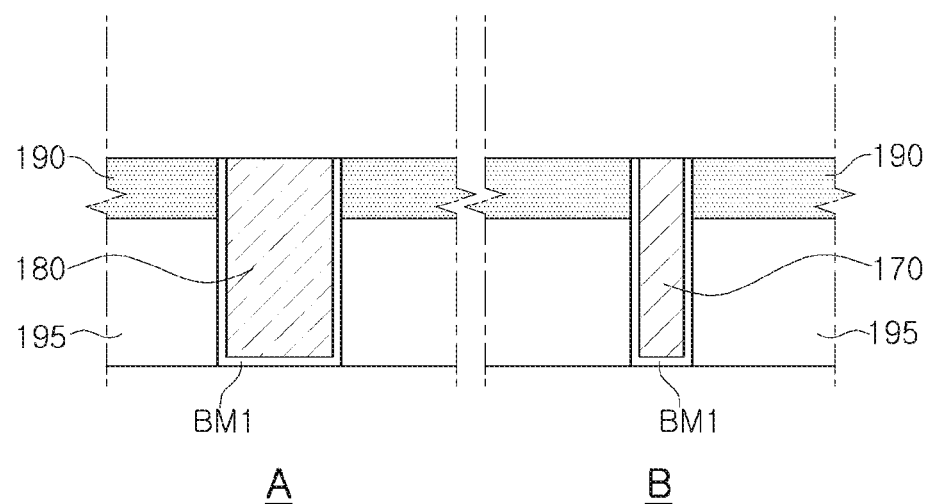
FIGS. 14A, 14B, 14C, 14D, 14E, 14F, 14G, 14H, and 14I are cross-sectional diagrams illustrating a method of manufacturing a semiconductor device according to some example embodiments of the inventive concepts.

Referring to FIG. 14A, a first bonding pad 180 including a first barrier metal layer BM1 may be formed in a first region A and a first metal pattern 170 including a first barrier metal layer BM1 may be formed in a second region B.

A trench may be formed by a mask pattern forming process and an etching process, and the first barrier metal layer BM1 may be formed in the trench. The first bonding pad 180 and the first metal pattern 170 may be formed by filling the first barrier metal layer BM1 with a conductive material and performing a planarization process. The conductive material may include, for example, Cu.

Figure 14B:
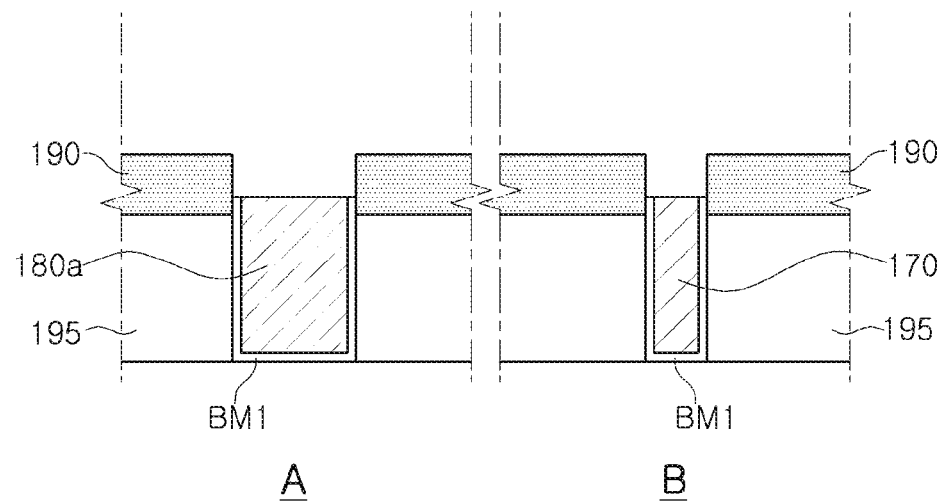

Referring to FIG. 14B, a first conductive layer 180a and the recessed first metal pattern 170 of the first bonding pad may be formed. A recessed structure formed of a conductive material may be formed by performing a chemical mechanical polishing (CMP) process or a dry etching process with respect to the first bonding pad 180 and the first metal pattern 170.

Figure 14C:
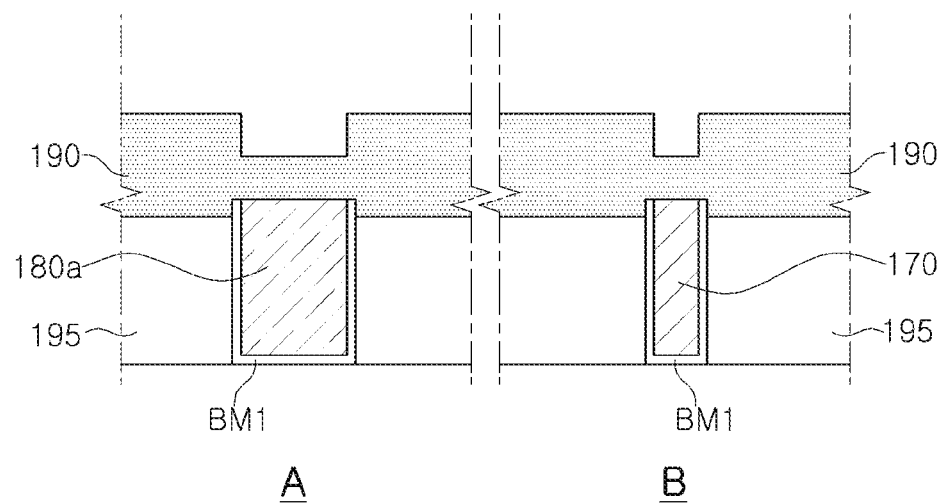

Referring to FIG. 14C, an insulating material the same as that of the first bonding insulating layer 190 may be deposited on the first conductive layer 180a and the first metal pattern 170 of the first bonding pad and the first bonding insulating layer 190.

Figure 14D:
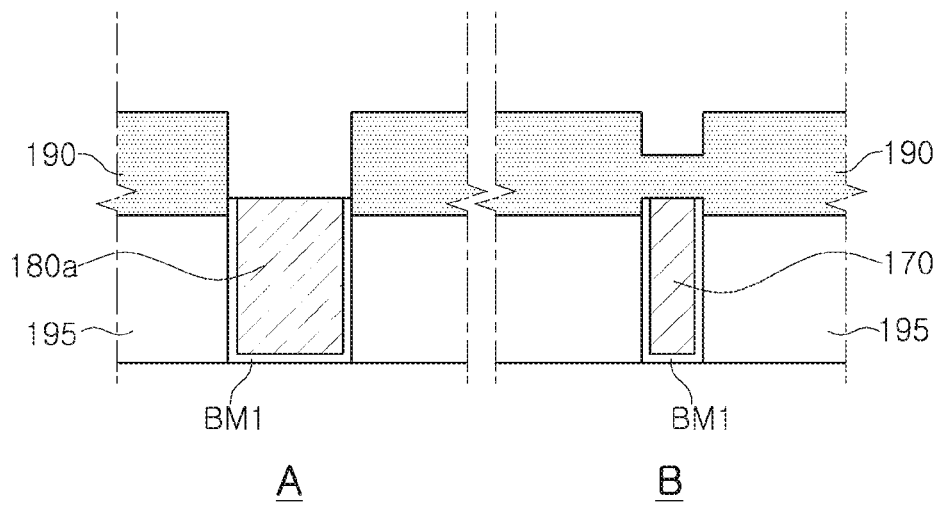
Figure 14E:
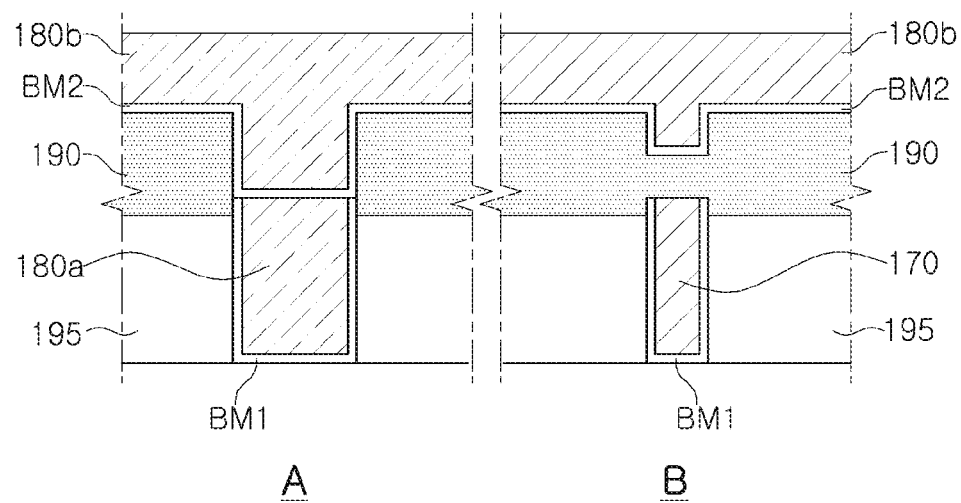

Referring to FIG. 14D, an upper portion of the first conductive layer 180a of the first bonding pad in the first region A may be exposed by performing a photolithography process, an etching process, with respect to the first bonding insulating layer 190 in the first region A.

Referring back to FIG. 14E, the second barrier metal layer BM2 may be formed on the upper portion of the first conductive layer 180a. The second barrier metal layer BM2 and a second conductive layer 180b may partially or entirely cover the first conductive layer 180a. The second barrier metal layer BM2 may be one material selected from among Ta, TaN, TaSiN, Ti, TiN, TiSiN, W, WN, or a combination thereof. The second conductive layer 180b may be formed by disposing a conductive material the same as that of the first conductive layer 180a on the second barrier metal layer BM2.

Referring back to FIGS. 9A and 9B, through a planarization process, an upper surface of the second conductive layer 180b including the second barrier metal layer BM2 may be exposed in the first region A, and an upper surface of the first bonding insulating layer 190 may be exposed in the second region B. In FIG. 11E, as the second barrier metal layer BM2 and the second conductive layer 180b may partially or entirely cover the first conductive layer 180a, a second width a2 of the first upper bonding pad may be narrower than a first width a1 of the first lower bonding pad as illustrated in FIG. 9B, and the first bonding pad 180 having an upper surface of the first conductive layer 180a covered by the second barrier metal layer BM2 may be formed. The second barrier metal layer BM2 may form the first bonding pad 180 partially covering an upper surface of a first conductive layer 180a.

Figure 14F:
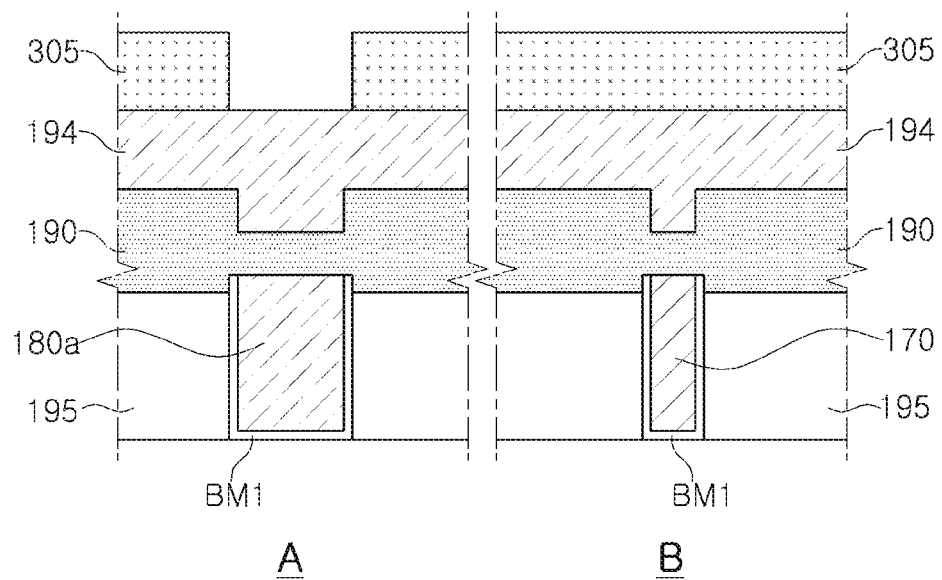

Referring to FIG. 14F, after the manufacturing processes in FIGS. 14A to 14C, a third insulating layer 194 may be also be formed. The third insulating layer 194 may include an insulating material such as silicon oxide, and may allow a planarization process to be easily performed, or may be used as an etching stop layer. A fifth mask pattern 305 for exposing the third insulating layer 194 on an upper portion of the first conductive layer 180a of the first bonding pad may be formed on the third insulating layer 194.

Figure 14G:
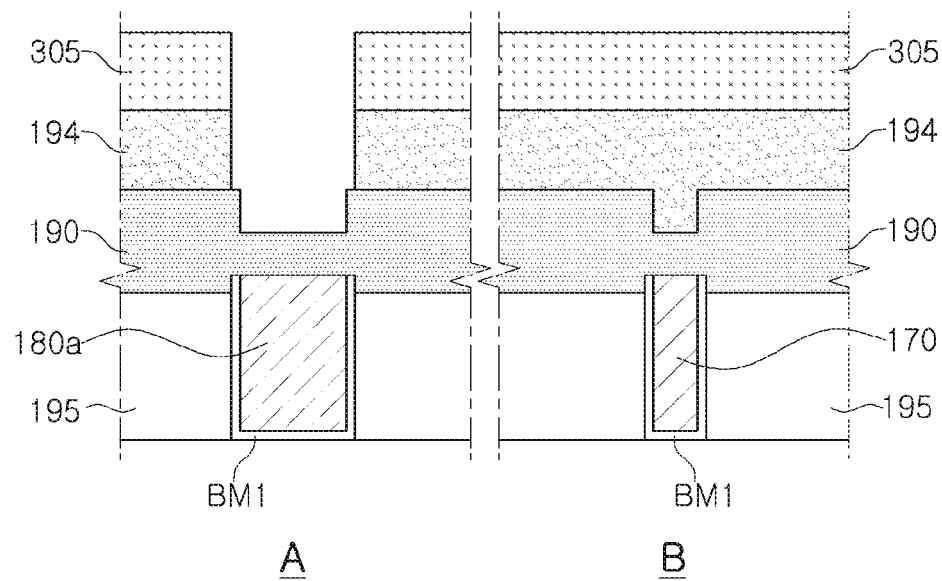

Referring to FIG. 14G, the third insulating layer 194 in the first region may be etched using a fifth mask pattern 305 as an etching mask. The etching process may be an anisotropic etching process.

Figure 14H:
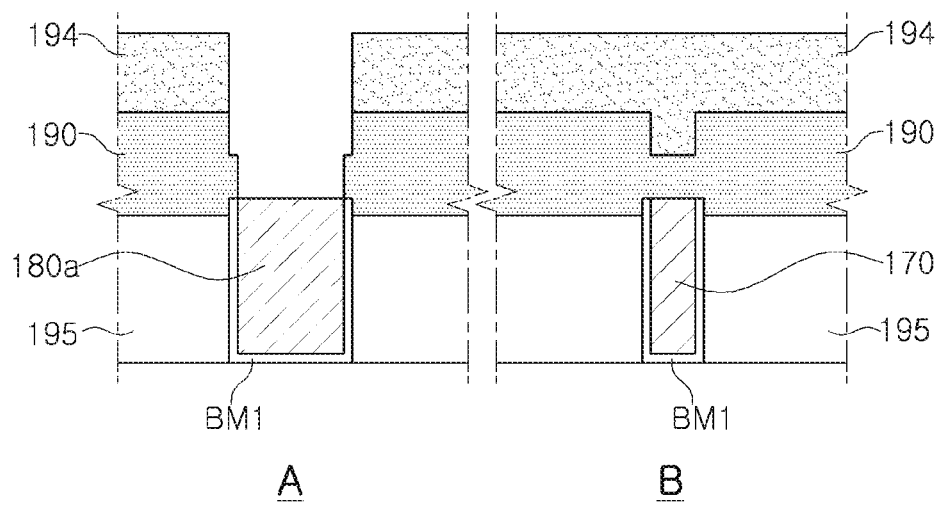

Referring to FIG. 14H, an additional etching process may be performed using the third insulating layer 194 as an etching mask, and an upper portion of the first conductive layer 180a of the first bonding pad may be exposed.

Figure 14I:
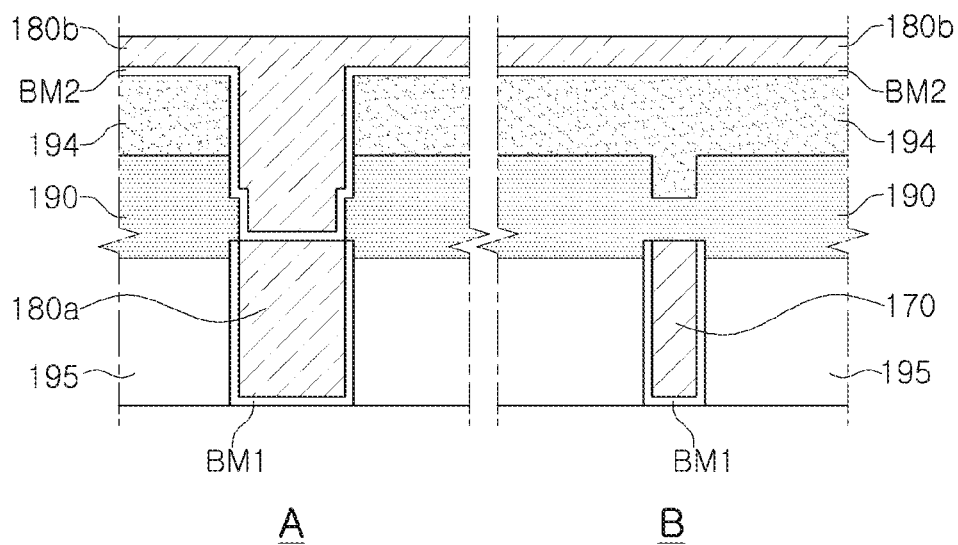

Referring to FIG. 14I, a second barrier metal layer BM2 may be formed on an upper portion of the first conductive layer 180a. In this case, the second barrier metal layer BM2 and the second conductive layer 180b may entirely or partially cover the first conductive layer 180a. The second conductive layer 180b may be formed by disposing a conductive material the same as that of the first conductive layer 180a on the second barrier metal layer BM2 and performing a planarization process. Thereafter, through a planarization process, an upper surface of the second conductive layer 180b including the second barrier metal layer BM2 may be exposed in the first region A, and an upper surface of the first bonding insulating layer 190 may be exposed in the second region B. In this case, the second barrier metal layer BM2 and the second conductive layer 180b may partially cover the first conductive layer 180a such that some example embodiments illustrated in FIG. 9B may be manufactured.

According to some example embodiments, in the structure in which two or more substrate structures are bonded to each other, by forming a metal pattern used for wiring along with a bonding pad on a layer on which the bonding pad is formed and using the metal pattern as input and output wiring, the number of processes and costs may reduced.

While some example embodiments have been shown and described above, it will be apparent to those skilled in the art that modifications and variations could be made without departing from the scope of the inventive concepts as defined by the appended claims.

What is claimed is:

1. A semiconductor device, comprising:
   a first structure including a first bonding structure; and
   a second structure on the first structure, the second structure including a second bonding structure connected to the first bonding structure,
   wherein the first bonding structure includes
      a first insulating layer,
      a first bonding insulating layer on the first insulating layer;
      first bonding pads penetrating at least a portion of the first insulating layer and the first bonding insulating layer; and
      first metal patterns in the first insulating layer, the first metal patterns in contact with the first bonding insulating layer, the first metal patterns each having an upper surface closer to a lower surface of the first structure, in a vertical direction extending perpendicular to the lower surface of the first structure, than upper surfaces of the first bonding pads,
   wherein the second bonding structure includes
      a second bonding insulating layer bonded to the first bonding insulating layer;
      a second insulating layer on the second bonding insulating layer; and
      second bonding pads penetrating at least a portion of the second bonding insulating layer, the second bonding pads connected to separate, respective first bonding pads of the first bonding pads.

2. The semiconductor device of claim 1, wherein lower surfaces of the first bonding pads and lower surfaces of the first metal patterns are a same distance from the lower surface of the first structure in the vertical direction.

3. The semiconductor device of claim 1, wherein
   the first bonding insulating layer includes a first region and a second region, and
   the first bonding insulating layer has a first thickness in the first region, and the first bonding insulating layer has a second thickness in the second region, the second thickness being greater in magnitude than the first thickness.

4. The semiconductor device of claim 3, wherein the second thickness is greater in magnitude than the first thickness by about 0.2 μm to about 0.3 μm.

5. The semiconductor device of claim 3, wherein
   the first bonding pads each penetrate the first bonding insulating layer in the first region, and
   the first metal patterns are each in contact with a lower surface of the first bonding insulating layer in the second region.

6. The semiconductor device of claim 1, wherein upper surfaces of the first metal patterns are further from the lower surface of the first structure in the vertical direction than a lowermost surface of the first bonding insulating layer.

7. The semiconductor device of claim 1, wherein each of the first metal patterns and the first and second bonding pads includes a conductive layer and a barrier metal layer partially covering the conductive layer.

8. The semiconductor device of claim 1, wherein the first bonding pads each include
   a first conductive layer;
   a first barrier metal layer covering a lower surface and a lateral surface of the first conductive layer;
   a second conductive layer on the first conductive layer; and
   a second barrier metal layer covering a lower surface and a lateral surface of the second conductive layer.

9. The semiconductor device of claim 8, wherein the second barrier metal layer covers at least a portion of an upper surface of the first conductive layer.

10. The semiconductor device of claim 1, wherein the first insulating layer and the first bonding insulating layer include different materials.

11. The semiconductor device of claim 1, wherein the first bonding insulating layer includes at least one of SiCN, SiO, SiN, SiOC, SiON, or SiOCN.

12. The semiconductor device of claim 1, further comprising:

an intermediate insulating layer between the first bonding insulating layer and the first metal patterns in at least one region of the first bonding insulating layer, wherein the intermediate insulating layer includes a material different from a material of the first bonding insulating layer.

13. The semiconductor device of claim 1, wherein the second bonding structure further includes second metal patterns in the second insulating layer, the second metal patterns in contact with the second bonding insulating layer, the second metal patterns each having a lower surface distal to the lower surface of the first structure in the vertical direction in relation to lower surfaces of the second bonding pads.

14. The semiconductor device of claim 1, wherein
the first structure further includes
   a first substrate;
   a plurality of circuit devices on the first substrate; and
   wiring layers electrically connecting the first bonding pads and the first metal patterns to the plurality of circuit devices, and
the second structure further includes
   a second substrate;
   a plurality of gate electrode layers stacked between the second substrate and the second bonding structure and isolated from direct contact with each other; and
   a channel structure penetrating the plurality of gate electrode layers.

15. A semiconductor device, comprising:
a first structure including a first bonding structure; and
a second structure on the first structure, the second structure including a second bonding structure connected to the first bonding structure,
wherein the first bonding structure includes
   a first insulating layer,
   a first bonding insulating layer on the first insulating layer,
   first bonding pads penetrating a portion of the first insulating layer and the first bonding insulating layer, and
   first metal patterns in the first insulating layer, the first metal patterns in contact with the first bonding insulating layer, and
wherein the first bonding insulating layer includes a first region penetrated by the first bonding pads and a second region in contact, at one or more lower surfaces of the first bonding insulating layer, with upper surfaces of the first metal patterns such that the first bonding insulating layer covers the upper surfaces of the first metal patterns.

16. The semiconductor device of claim 15, wherein
a distance of a first lowermost surface of the first bonding insulating layer in the first region from a lower surface of the first structure in a vertical direction that is perpendicular to the lower surface of the first structure is different from a distance of a second lowermost surface of the first bonding insulating layer in the second region from the lower surface of the first structure in the vertical direction, and the first metal patterns are on a lower portion of the second lowermost surface of the first bonding insulating layer.

17. The semiconductor device of claim 15, wherein
a distance of a first lowermost surface of the first bonding insulating layer in the first region from a lower surface of the first structure in a vertical direction that is perpendicular to the lower surface of the first structure is the same as a distance of a second lowermost surface of the first bonding insulating layer in the second region from the lower surface of the first structure in the vertical direction, and a distance of the upper surfaces of the first metal patterns from the lower surface of the first structure in the vertical direction is greater than the distance of the first and second lowermost surfaces of the first bonding insulating layer from the lower surface of the first structure in the vertical direction.

18. A semiconductor device, comprising:
a first bonding structure having a first bonding surface; and
a second bonding structure on the first bonding structure and having a second bonding surface in contact with the first bonding surface,
wherein the first bonding structure includes
   a first insulating layer,
   a first bonding insulating layer on the first insulating layer and at least partially defining the first bonding surface,
   first bonding pads that penetrate at least a portion of the first insulating layer and the first bonding insulating layer and at least partially define the first bonding surface, and
   first metal patterns in the first insulating layer and each having an upper surface below the first bonding surface.

19. The semiconductor device of claim 18, wherein
the first bonding insulating layer includes a first region in which the first bonding pads are located and a second region in which the first metal patterns are located, and
a distance between upper surfaces of the first metal patterns and the first bonding surface is greater than a thickness of the first region of the first bonding insulating layer.

20. The semiconductor device of claim 18, wherein upper surfaces of the first bonding pads are coplanar with an upper surface of the first bonding insulating layer.

* * * * *